US007772657B2

(12) United States Patent
Vaganov

(10) Patent No.: US 7,772,657 B2
(45) Date of Patent: Aug. 10, 2010

(54) THREE-DIMENSIONAL FORCE INPUT CONTROL DEVICE AND FABRICATION

(76) Inventor: Vladimir Vaganov, 129 El Porton, Los Gatos, CA (US) 95032

( * ) Notice: Subject to any disclaimer, the term of this patent is extended or adjusted under 35 U.S.C. 154(b) by 531 days.

(21) Appl. No.: 11/649,992

(22) Filed: Jan. 4, 2007

(65) Prior Publication Data
US 2007/0245836 A1 Oct. 25, 2007

Related U.S. Application Data

(63) Continuation-in-part of application No. 11/025,642, filed on Dec. 28, 2004, now Pat. No. 7,554,167.

(60) Provisional application No. 60/756,200, filed on Jan. 5, 2006.

(51) Int. Cl.
*H01L 31/058* (2006.01)
(52) U.S. Cl. .................. 257/415; 257/730; 257/778; 257/E23.123; 257/E23.124
(58) Field of Classification Search ................ 257/415, 257/730, 778, E23.123, E23.124
See application file for complete search history.

(56) References Cited

U.S. PATENT DOCUMENTS

| 4,680,577 | A |   | 7/1987  | Straayer et al.       |
|-----------|---|---|---------|-----------------------|
| 4,951,510 | A | * | 8/1990  | Holm-Kennedy et al. ........... 73/862.041 |
| 4,967,605 | A | * | 11/1990 | Okada ............... 73/862.044 |
| 5,035,148 | A | * | 7/1991  | Okada ............... 73/862.044 |
| 5,263,375 | A | * | 11/1993 | Okada ............... 73/862.042 |
| 5,489,900 | A |   | 2/1996  | Cali et al.           |
| 5,499,041 | A |   | 3/1996  | Brandenburg et al.    |
| 5,640,178 | A |   | 6/1997  | Endo et al.           |
| 5,682,000 | A | * | 10/1997 | Okada ............... 73/862.043 |
| 6,121,954 | A |   | 9/2000  | Seffernick            |
| 6,185,814 | B1| * | 2/2001  | Okada ............... 29/621.1 |
| 6,195,082 | B1|   | 2/2001  | May et al.            |
| 6,211,558 | B1|   | 4/2001  | Ismail et al.         |
| 6,369,435 | B1|   | 4/2002  | Igel                  |

(Continued)

FOREIGN PATENT DOCUMENTS

WO    WO2005/033646    4/2005

OTHER PUBLICATIONS

Notice of Allowance from 11/025,642 mailed Feb. 23, 2009.

(Continued)

*Primary Examiner*—Charles D Garber
*Assistant Examiner*—Angel Roman
(74) *Attorney, Agent, or Firm*—Fitch, Even, Tabin & Flannery

(57) ABSTRACT

The present invention provides three-dimensional force input control devices for use in sensing vector forces and converting them into electronic signals for processing in a electronic signal processing system with all components within die fabricated from the single semiconductor substrate. In some embodiments, the die has an elastic element, a frame formed around said elastic element, at least three mechanical stress sensitive IC components located in the elastic element, at rigid island element which transfers an external vector force to the elastic element and through the IC components provides electrical output signal, this rigid island has a height bigger than the thickness of the frame element, an external force-transferring element coupling the rigid island element with an external force and electronic circuit for processing output signals from the mechanical stress sensitive IC components.

29 Claims, 20 Drawing Sheets

U.S. PATENT DOCUMENTS

| | | | |
|---|---|---|---|
| 6,373,265 B1 | 4/2002 | Morimoto et al. | |
| 6,477,903 B2 | 11/2002 | Okada | |
| 6,518,954 B1 | 2/2003 | Chen | |
| 6,523,423 B1 | 2/2003 | Namerikawa | |
| 6,530,283 B2 * | 3/2003 | Okada et al. | 73/780 |
| 6,570,556 B1 | 5/2003 | Liao | |
| 6,642,857 B1 | 11/2003 | Schediwy et al. | |
| 6,654,004 B2 | 11/2003 | Hoggarth | |
| 6,654,005 B2 | 11/2003 | Wang | |
| 6,697,049 B2 | 2/2004 | Lu | |
| 6,707,445 B1 | 3/2004 | Hasemann | |
| 6,750,408 B2 | 6/2004 | Inoue et al. | |
| 6,753,850 B2 | 6/2004 | Poole | |
| 6,771,992 B1 | 8/2004 | Tomura | |
| 6,774,887 B2 | 8/2004 | Lu | |
| 6,788,291 B2 | 9/2004 | Burry | |
| 6,791,532 B2 | 9/2004 | Hirano et al. | |
| 6,809,529 B2 | 10/2004 | Okada | |
| 6,809,721 B2 | 10/2004 | Love | |
| 6,859,048 B2 | 2/2005 | Okada | |
| 6,903,724 B2 | 6/2005 | Grivas | |
| 6,920,041 B2 | 7/2005 | Oross | |
| 6,940,495 B2 | 9/2005 | Morimoto | |
| 6,950,092 B2 | 9/2005 | Buss | |
| 6,952,197 B1 | 10/2005 | Nakamura | |
| 7,123,028 B2 | 10/2006 | Okada et al. | |
| 7,123,240 B2 | 10/2006 | Kemppinen | |
| 7,441,470 B2 * | 10/2008 | Morimoto | 73/862.045 |
| 7,554,167 B2 | 6/2009 | Vaganov | |
| 2001/0003326 A1 | 6/2001 | Okada et al. | |
| 2002/0075234 A1 | 6/2002 | Poole | |
| 2002/0149564 A1 | 10/2002 | Simpson et al. | |
| 2002/0151282 A1 | 10/2002 | Wang | |
| 2002/0190949 A1 | 12/2002 | Hirano et al. | |
| 2003/0030452 A1 | 2/2003 | Okada et al. | |
| 2003/0052861 A1 | 3/2003 | Peng | |
| 2003/0076302 A1 | 4/2003 | Langstraat | |
| 2003/0094663 A1 | 5/2003 | Sato et al. | |
| 2003/0105576 A1 | 6/2003 | Kamiya | |
| 2004/0027331 A1 | 2/2004 | Mochizuki | |
| 2004/0222968 A1 | 11/2004 | Endo et al. | |
| 2004/0227732 A1 | 11/2004 | Kemppinen | |
| 2005/0160814 A1 | 7/2005 | Vaganov et al. | |
| 2005/0161489 A1 | 7/2005 | Pikulski | |
| 2005/0170544 A1 | 8/2005 | Chang et al. | |
| 2005/0178214 A1 | 8/2005 | Okada | |
| 2005/0190152 A1 | 9/2005 | Vaganov | |
| 2005/0190159 A1 | 9/2005 | Skarine | |
| 2007/0000335 A1 * | 1/2007 | Morimoto | 73/862.045 |
| 2007/0245836 A1 | 10/2007 | Vaganov | |
| 2008/0105936 A1 | 5/2008 | Nakamura | |

OTHER PUBLICATIONS

Vaganov, Vladimir, U.S. Appl. No. 11/025,642.

USPTO, Office Action from U.S. Appl. No. 11/025,642, mailed Aug. 28, 2008, 6 pages.

Patent Cooperation Treaty; International Search Report issued in corresponding PCT application PCT/US07/00411 mailed Oct. 04, 2007.

*First Office Action including translation from the Patent Office of the State Intellectual Property Office of the People's Republic of China* for App. No. 2007800007723 dispatched Oct. 9, 2009.

*Written Opinion by the Austrian Patent Office* for App. No. 2008003964 mailed Sep. 29, 2009.

Second Office Action from the State Intellectual Property Office of People's Republic of China for App. No. 200780000772.3 dispatched Apr. 8, 2010.

Supplementary European Search Report for App. No. 07709602 completed Apr. 30, 2010.

* cited by examiner

PRIOR ART

US 7,772,657 B2

THREE-DIMENSIONAL FORCE INPUT CONTROL DEVICE AND FABRICATION

This application claims priority to Provisional Patent Application No. 60/756,200 filed on Jan. 5, 2006, and which is incorporated herein by reference in its entirety and for all purposes. This application is also a Continuation in Part to patent application Ser. No. 11/025,642, Dec. 28, 2004 Pub. No. US 2005/0190152 AI, now U.S. Pat. No. 7,554,167, and which is incorporated herein by reference for all purposes.

BACKGROUND

1. Field of the Invention

The present invention relates generally to semiconductor devices, Micro Electro Mechanical Systems (MEMS), sensors and more specifically to three dimensional (3D) three-axis force sensors integrated with signal processing electronic circuits on one substrate. In particular, it relates to three-axis finger force sensors, finger-mouse and micro-joysticks for consumer and other applications.

2. Background 3D force sensors based on micro-machined silicon chips with stress sensitive components on flexible diaphragm are known. Prior art shown in FIG. 1, uses a sensor chip 10 from a rigid frame 12 and rigid central part 16 of a die, boss, connected with the frame by a thinner diaphragm 14. An externally applied force is transferred to the rigid island 16, the deflection of the island creates deformation and stress in the elastic diaphragm element 14, reaching the locations of the stress sensitive IC components 18, 20, 22. Because the rigid island 16 is located within the thickness dimension of a die 10 and the width of a circular diaphragm is small and in the sub-millimeter range, it is very hard to apply external forces in lateral X and Y directions to the rigid island 16 to provide good response, and hence their use is constrained from many consumer devices and interfaces.

In order to resolve this deficiency a rigid force-transferring element 31 is added to the structure of the die 10 and island 16. This rigid force-transferring element 31 is firmly coupled to the rigid island 16 of a sensor die 10 through intermediate layer 33. This extension of the rigid island height above the die frame thickness enhances sensor sensitivity to the applied vector force in all orthogonal directions. These components of force are transferred to a rigid island of the sensor die and then to the elastic element and sensitive IC components.

However, the disadvantages of these kinds of solutions are the requirement of additional wafer for the rigid force-transferring elements, additional micro-machining, aligning and bonding two wafers, a more complicated process of separating dice from the wafer and generally a more expensive fabrication process.

What is needed are devices that reduce cost of fabrication and manufacture as well as providing an easy integration with the higher density IC circuitry on silicon substrate.

SUMMARY

The present invention discloses a three-dimensional force input control device for sensing vector forces and converting them into electronic signals for processing in a electronic signal processing system with all components within a sensor die fabricated from the single semiconductor substrate. The typical device comprises a sensor die formed within semiconductor substrate, an elastic element within said semiconductor substrate, a frame formed around said elastic element and coupled with at least part of the periphery of said elastic element all within the substrate, at least three mechanical stress sensitive IC components located in the elastic element for providing electrical output signals proportional to the mechanical stress in the location of the IC components, at least one rigid island element formed in the substrate and coupled with the elastic element, this rigid island transfers an external vector force to the elastic element and through the IC components which provide electrical output signal, this rigid island has a height bigger than the thickness of the frame minus thickness of the elastic element, at least one spring element coupling the force-transferring element with an external force and at least one electronic circuit for processing output signals from the mechanical stress sensitive IC components.

All elements can vary in design and material in order to realize different aspects and advantages.

Several methods of fabrication are disclosed, with a typical method comprising the steps of providing a semiconductor substrate having a side one and a side two; fabricating stress-sensitive IC components and signal processing IC on side one of the substrate; fabricating closed trenches on side two of the substrate, the trenches forming boundaries defining elastic elements, frame elements, and rigid islands, trenches for die separation, and removing additional substrate material from side two of the substrate in the frame area leaving the dimension of the rigid island protruding outward from side two and larger than the remaining thickness dimension of the frame minus the thickness of elastic element, leaving the rigid island extending outward from the substrate for coupling with external force transferring elements or for receiving external mechanical forces in any and all directions. Removal of part of the substrate from side two frame element can be done by selective etching.

A variation for fabricating closed trenches on side two of the substrate within a die area further comprises depositing protective masking layer on side two of the substrate; photolithographically defining a pattern of the rigid island, elastic element, frame and separating dice trenches, removing masking layer from elastic element and separating dice trenches and etching substrate from side two of the substrate in the elastic element and separating dice trenches areas to a selected thickness such that the closed separating trenches provide the shape and thickness contours in the substrate for separating the die in accordance with the defined pattern using less substrate and producing less waste.

DETAILED DESCRIPTION

Figure 1:
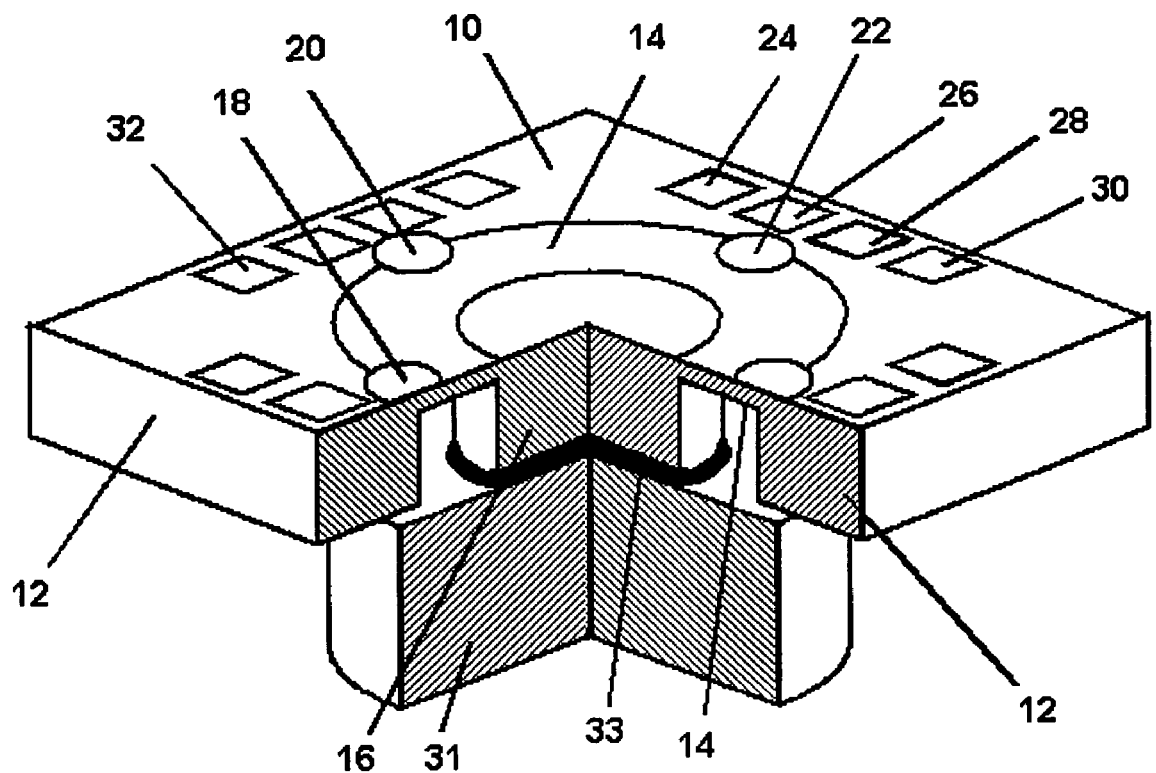
FIG. 1, shows a prior art 3D force sensor chip with rigid force transferring island located within the thickness dimension of a die and additional force transferring element connected to the top portion of the rigid island.

Specific embodiments of the invention will now be described in detail with reference to the accompanying figures.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Objects and Advantages

An object of the present invention is to provide a 3-dimensional force input control device for high volume consumer markets like cell phones, portable gamers, digital cameras, etc.

Another object of the present invention is to provide a method of fabrication of a 3-dimensional force input control device used for integrating in various functions in electronic devices.

Another object of the present invention is to provide a low cost 3-dimensional force input control device.

Another object of the present invention is to provide a finger tip size 3-dimensional force input control device.

Another object of the present invention is to provide a high reliability 3-dimensional force input control device.

Another object of the present invention is to provide a high stability 3-dimensional force input control device.

Another object of the present invention is to provide a 3-dimensional force input control device, which accommodates a sufficiently low noise ratio between X,Y,Z sensitivities.

Another object of the present invention is to provide a 3-dimensional force input control device, which has low cross-axis sensitivity.

Another object of the present invention is to provide a 3-dimensional force input control device, which allows process integration with other sensors and CMOS.

Another object of the present invention is to provide a 3-dimensional force input control device, which is scalable.

Another object of the present invention is to provide a 3-dimensional force input control device with required combination of applied force and deflection.

Another object of the present invention is to provide a 3-dimensional force input control device, which enables better economics of manufacturability for high volume consumer markets.

Preferred Embodiments

FIGS. 2-13 show various embodiments of 3D force input control devices, dice microstructures and fabrication methods. The detailed description of the microstructures, devices and methods of fabrication according to the present invention are presented below.

Referring to embodiments in FIGS. 2(a)-(b), the isometric and a cross section view of the top planar side of a force sensor die and its major micro-constructive elements are shown. The isometric bottom side reflection and cross sectional view of the die are shown in FIG. 2b. The die 10 has frame 12 surrounding an elastic element 14. In this embodiment the elastic element 14 is circular and acts as a diaphragm. A central rigid island 16 is coupled to and within the center of the diaphragm 14. On a circular diaphragm 14 planar top side there are a number of areas 18, 20, 22 where mechanical stress sensitive IC components are effectively located. The IC components 18, 20, 22 are located on the periphery of the diaphragm adjacent to a frame 12, and electrically connected to contact pads 24 26 28 30 32 without metal conductors on the surface of a diaphragm. This configuration yields better sensor stability. Stress sensitive IC components 18 20 22 can also be located on the other areas of the diaphragm, for example in the areas 19,21,23, as shown in FIG. 2a.

The stress sensitive components occupy a relatively small area on the surface of the die. The majority of the area is used for integration of the signal processing IC. These IC can be located on the frame area 11, or on the rigid island area 13 or even on the elastic element area 14. As the process of stress sensitive components is compatible with the regular CMOS process, then any integrated circuit, which can be fabricated with CMOS process, can be integrated at the same die. In particular these integrated IC can provide the functions of analog signal amplification, analog analog-to-digital and digital-to-analog conversion, multiplexing, signal processing, gate logic, memory, digital interface, power management, encryption, compression and decompression, mixed signal processing, transmitting and receiving wireless signals, sensing various physical domains other than force and combinations.

An externally applied force is transferred to the rigid island 16, the deflection of the island creates deformation and stress in the elastic diaphragm element 14, reaching the locations of the stress sensitive IC components 18, 20, 22. These at least three sensitive IC components create a unique combination of the signals relative to a specific value and direction of the applied vector force. Calibration and processing sensor signals by integrated IC allows determination of the values of the force vector components and therefore also the value and a direction of the externally applied force.

Figure 2:
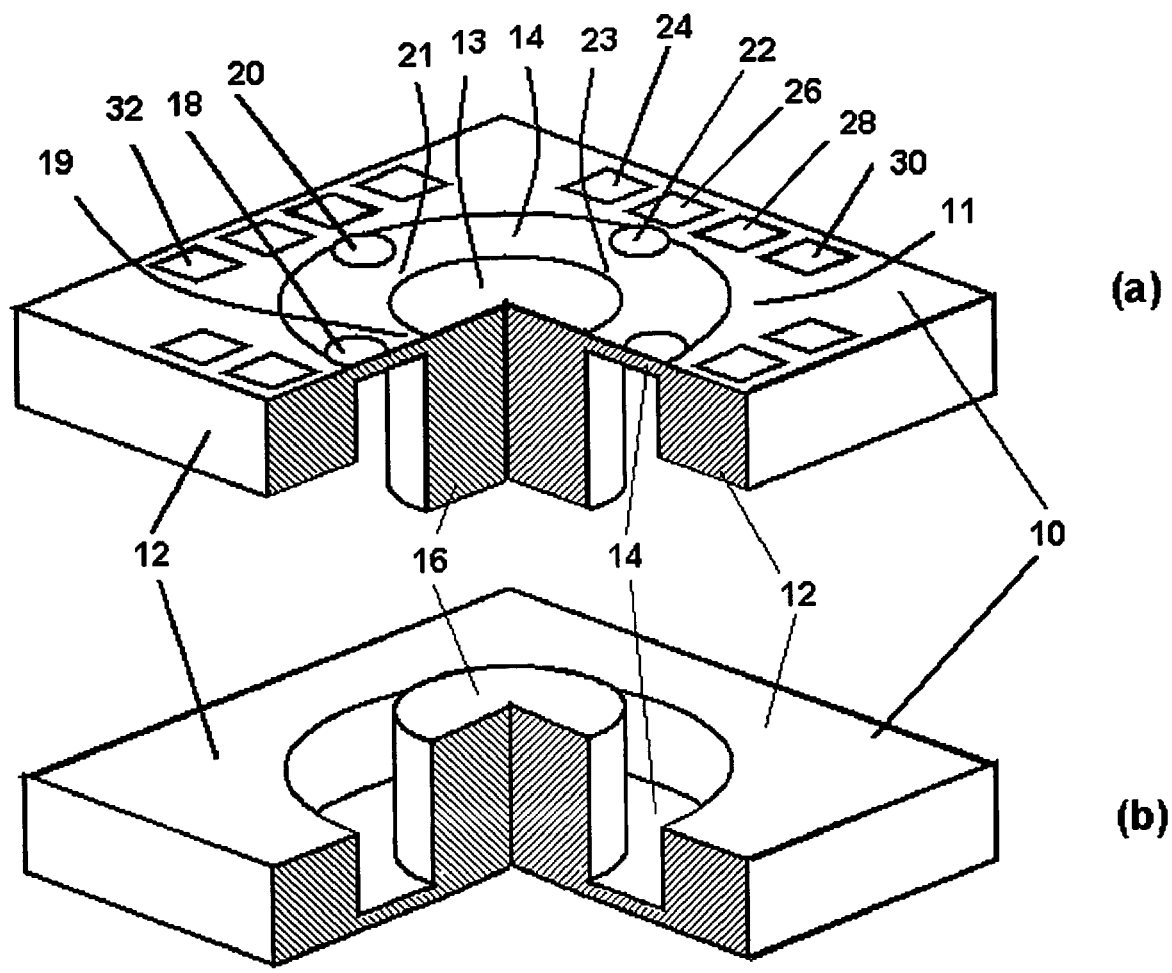
FIG. 2 shows an isometric top and bottom views of a force sensor die and its major micro-constructive elements according to an embodiment of the present invention.

In another embodiment, illustrated in the FIG. 2, the rigid island 16 located within the die 10 protrudes out from the frame 12, or has larger dimension of height than the thickness of the frame 12 minus the thickness of the diaphragm 14. It allows more efficiently apply an external force in lateral X and Y directions, provides high sensitivity, and simplifies the geometrical microstructure of the sensor die. The cost of manufacturing of the device is consequently reduced substantially due to the elimination of need for an additional wafer and corresponding processing steps. The described embodiment microstructure enhances sensor sensitivity to the applied vector force in all three orthogonal directions. These components of force are transferred directly to a rigid island of the sensor die and then to an elastic element and sensitive IC components.

The challenge of practical application of 3D force sensors, as input force controlled devices, is that the deflection of the rigid island 16 in semi-conductor type materials is negligible. The psychological response to the control of the applied force is based on the applied force or, for example pressure on the finger. For good finger control, some range of deflection is required, and this range would also increase the accuracy of applying input signals matching a range of applied force and sensitivity of the device.

Figure 3:
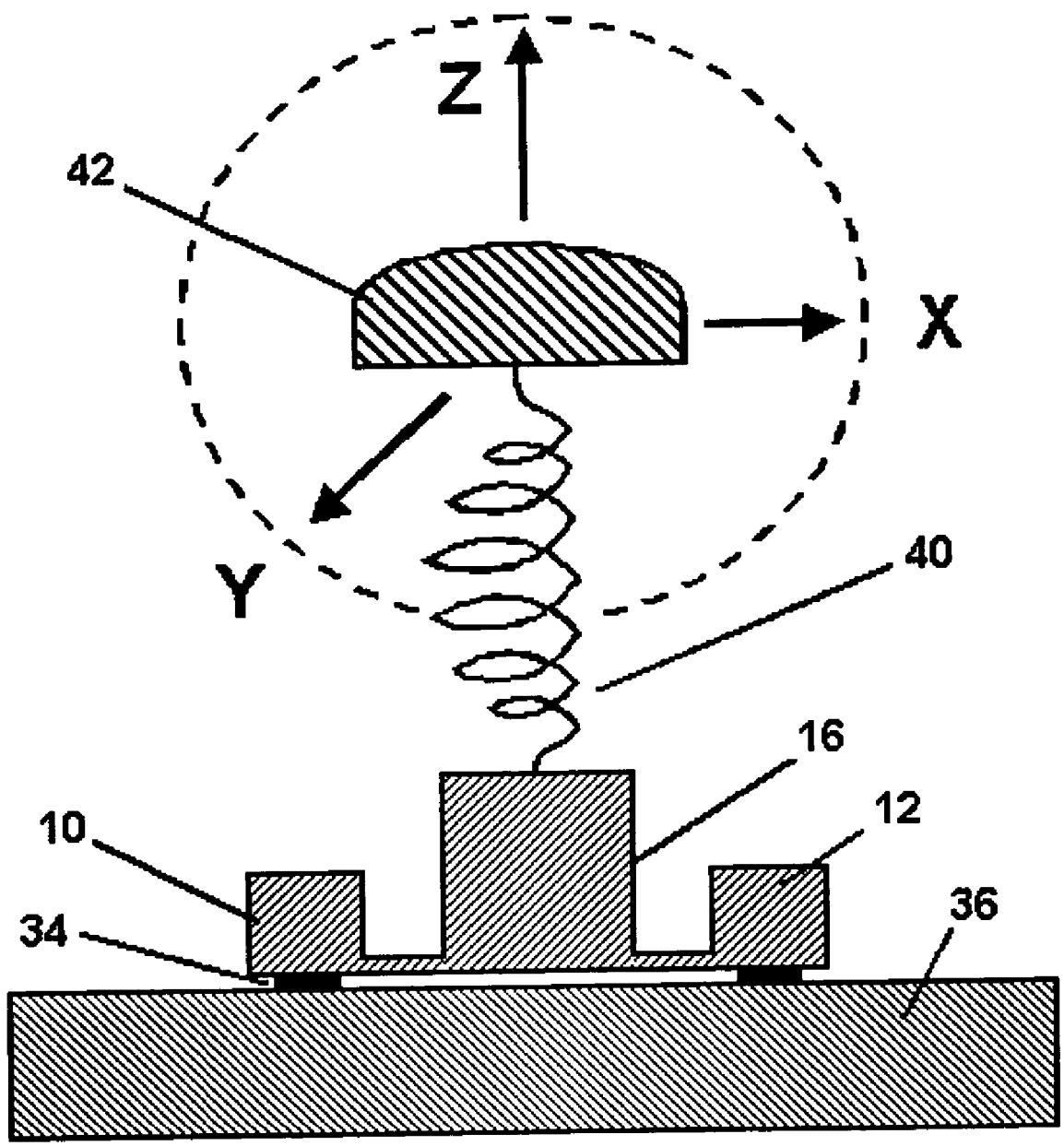
FIG. 3 shows the principle of a 3-dimensional input finger control of different functions in hand-held devices, where 3D force sensor die is connected to the external button for applying the force through a spring like element allowing control to achieve the required combination of sensitivity, range and accuracy of applied force or deflection according to an embodiment of the present invention.

An aspect of the invention resolving this issue is illustrated in FIG. 3 according to a third embodiment. A two ended spring element 40 is added to a sensor. The first end of spring element 40 is coupled to a rigid island 16 of a sensor die 10, which has a frame 12 and contact pads 34. The second end of the spring element 40 is connected to a button 42, where the external force vector is applied. The spring element 40 phases the deflection, increases the range of motion or applied force and accuracy of the input mechanical signal. As another benefit, the spring element 40 also increases the range of the opportunities in designing the microstructure of the sensor die for better performance from variable stiffness, reliability and cost.

Figure 4:
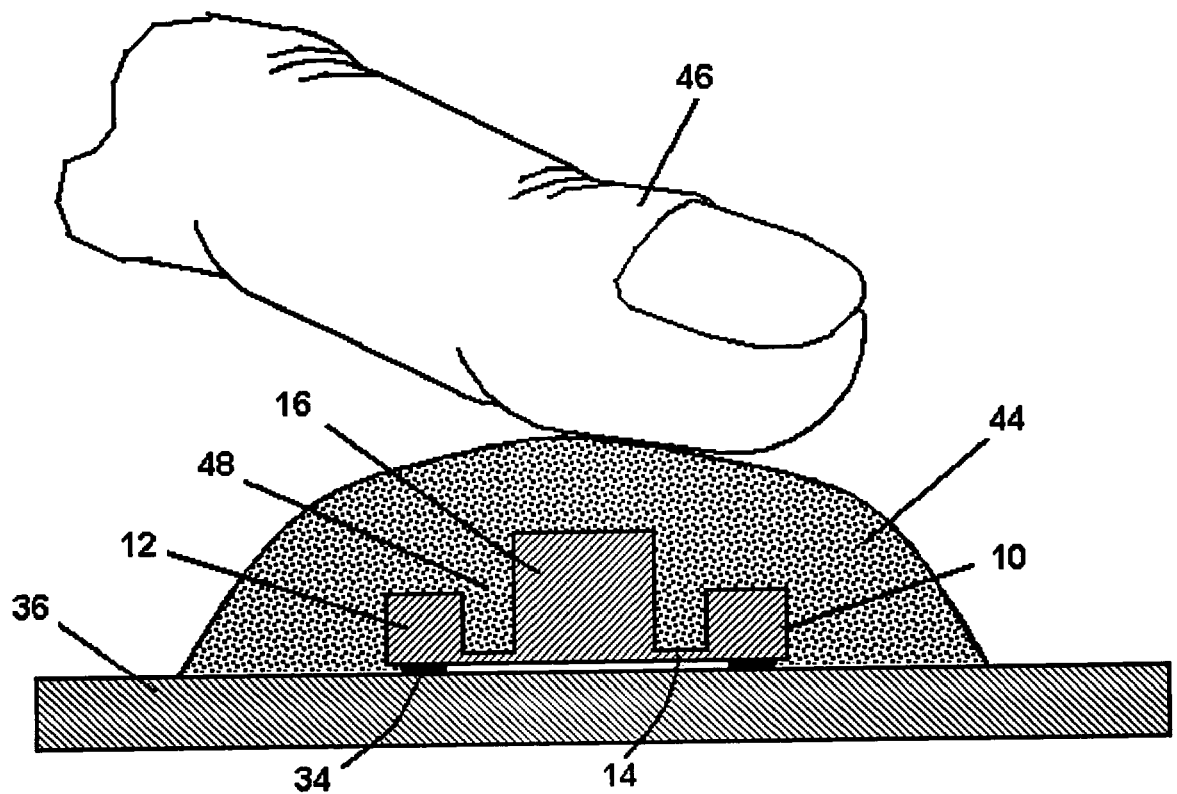
FIG. 4 shows an example of a flat low profile finger force control device based on elastomeric button directly connected to the force sensor die in accordance with an embodiment of the present invention.

As illustrated in FIG. 4, for some finger mouse applications, there is a need for a small but responsive deflection of a button and input force controlled devices. These are satisfied by shaping a flat button according to another embodiment of the invention. A sensor die 10 is bonded to a substrate 36 with the contact pads 34. The sensor die 10 is covered with elastic plastic material 44 forming a desired shape of a button.

The external force is applied to an elastic button, for example by a finger 46. Normal and sheer force are transferred through the elastic material of a button to the rigid island 16, elastic element 14 and finally to the stress sensitive IC components, result in output electrical signals proportional to an applied external force.

Figure 5:
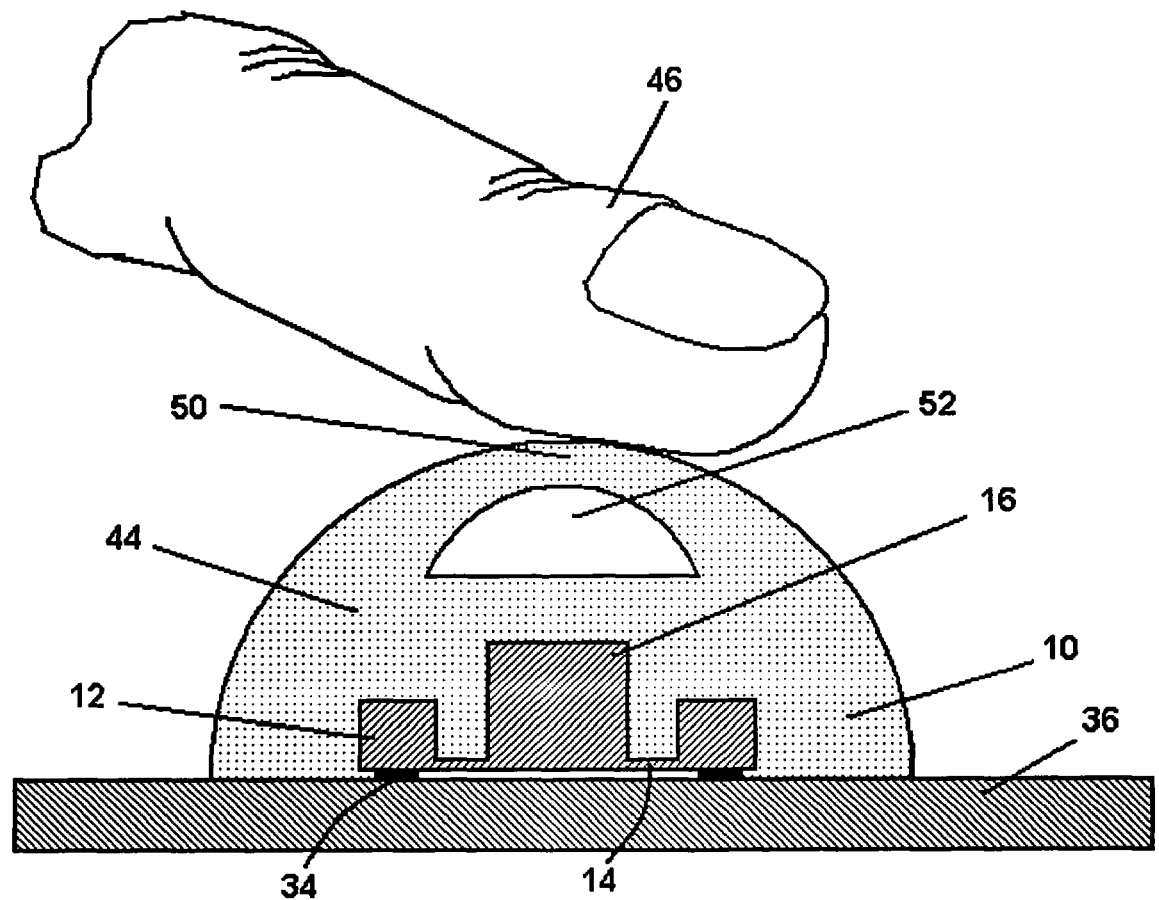
FIG. 5 illustrates a flat finger force control device with an elastomeric button directly connected to the rigid force-transferring element and comprising a tactile sensation mechanical feedback for sensing the click of a depressed button in accordance with an embodiment of the present invention.

The size of a sensor die and the viscosity and elasticity of an elastic material of the plastic button determine the response characteristics of the sensor to a large degree. The elastic plastic material 44 covers the sensor die 10 directly from the back profiled side and might filling in the cavity 48 between the frame 12 and the rigid island 16. Normal and sheer force applied by a force are transferred through the elastic material of a button directly to the rigid island 16 and then to the stress sensitive IC components. In many applications X and Y components of a force vector are used for a navigation by cursor on the screen of an electronic device while. When position of a cursor is selected then the action button is actuated. In most cases this action button is separated from the X-Y cursor navigation system like in finger point mouse of IBM Think Pad. Action button especially in portable devices preferably requires mechanical feedback or mechanical clicking function, which can be sensed by tactile sensors of the finger. As proposed finger force control device combines X,Y and Z control functions in one 3D sensor, Z control can be used as an action button eliminating the need for a separate control action button. The mechanical clicking feedback function can be incorporated in the device, as illustrated in FIG. 5, according to the fifth embodiment of the present invention.

The sensor die 10 is bonded to a substrate 36 with the contact pads 34. The sensor die 10 is covered with elastic plastic material 44 forming a desired shape of a button. The external force is applied to an elastic button, for example by a finger 46. Normal and Sheer force are transferred through the elastic material of a button to the rigid island 16, elastic element 14 and finally to the stress sensitive IC components, which result in output electrical signals proportional to X and Y components of the external force.

In the top portion of the elastic plastic button the tactile sensation mechanical feedback allows sensing the click of the pressed button, because it has a springy shell structure 50 with the cavity 52 beneath. When pressed from the top it buckles slightly, retaining continuity but sending a click sensation to the finger 46. This springy shell can be made from different materials including metals and plastics. The buckling action creates not only a tactile feedback but also generates short pulses in the mechanical sensitive components, which can be used as signals for activation of certain electronic action.

Figure 6:
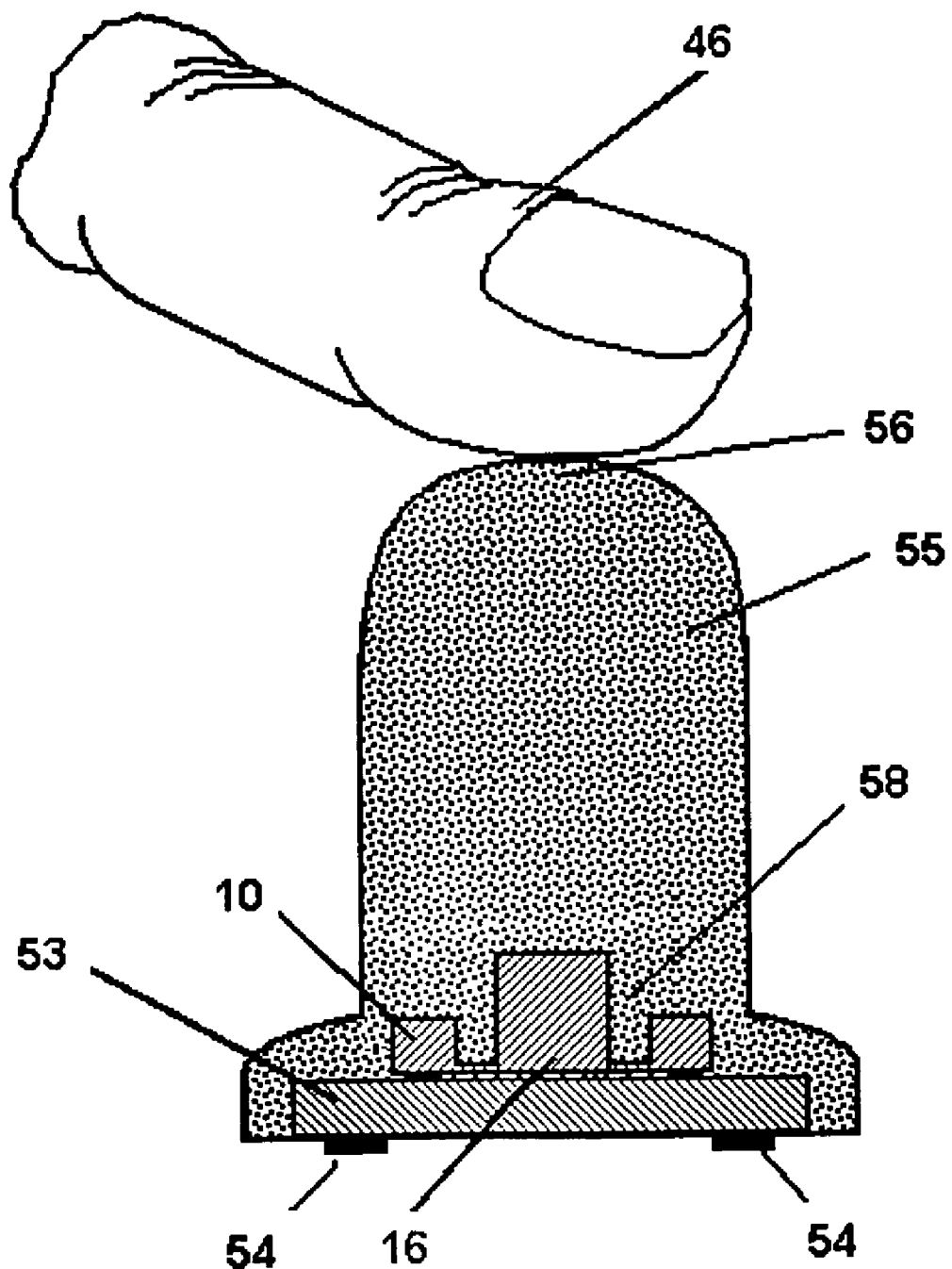
FIG. 6 shows an example of a joystick type finger force control device based on a elastomeric protrusion body spring back deformable element directly coupled with the rigid force-transferring element transferring the force vector to the sensor die mounted on the intermediate substrate die in accordance with an embodiment of the present invention.

As illustrated in FIG. 6, the spring element 54 providing required range of deflection and sensitivity can be made from the elastic plastic material according to sixth embodiment. In this embodiment the sensor die 10 and the rigid force-transferring island 16 are mounted on the intermediate substrate 53, which has contact pads 54. The elastic plastic package material 55 covers the above elements and forms a flexible protrusion. The extended end of the protrusion 56 serves as a button for tactile contact. An external force applied, via finger 46, to a button 56 bends the protrusion 55 creating mechanical stress and deflection within the plastic in the device base area 58 between the sensor die and the rigid force-transferring island 16. This induced stress is transferred to the sensor die and finally to the stress sensitive IC components. This design of a micro-joystick allows achieving very low cost in production due to its design simplicity and existing well-developed mass manufacturing technologies.

Figure 7:
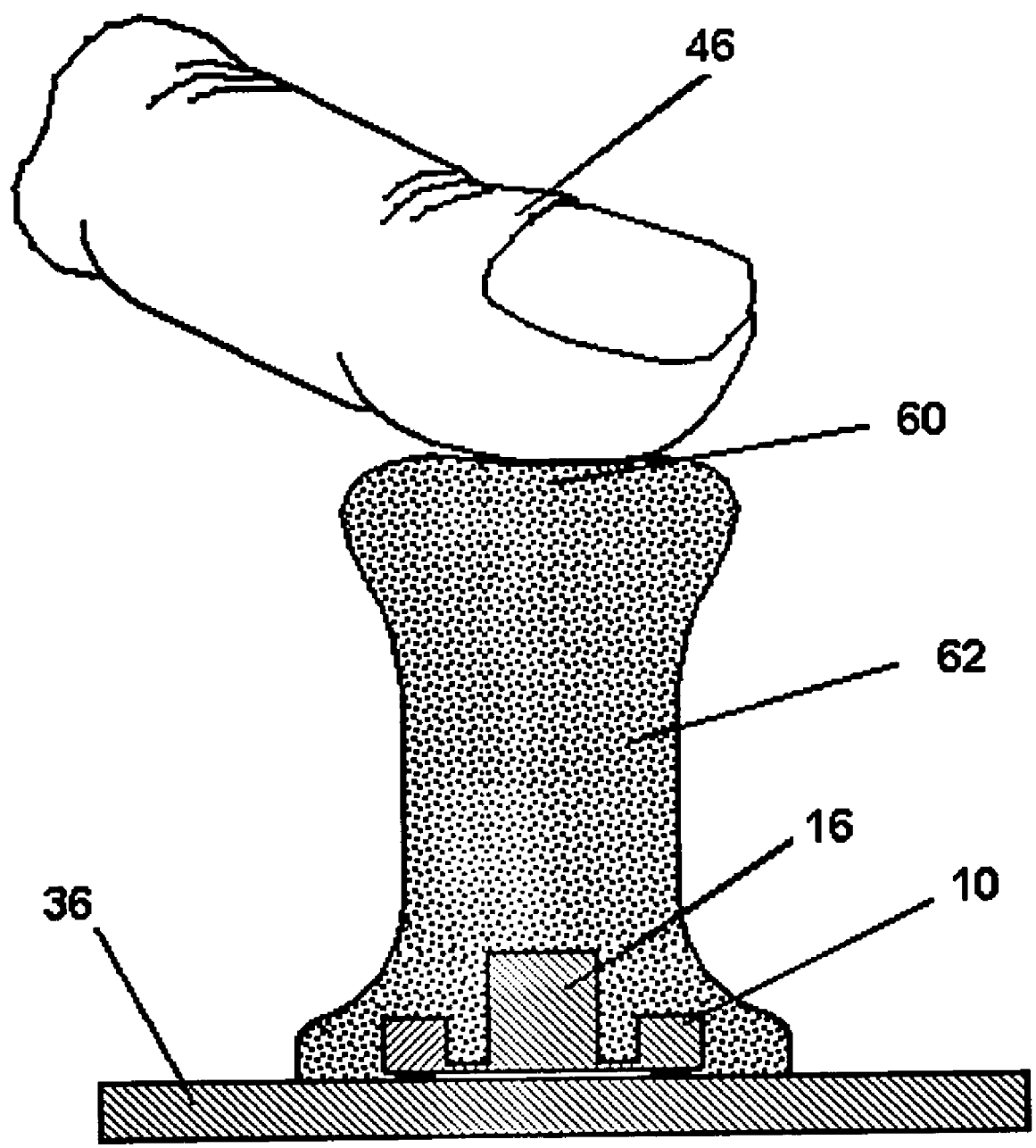
FIG. 7 shows another example of a flattened head joystick type finger force control device, where sensor die is mounted directly to the PCB in accordance with an embodiment of the present invention.

Another embodiment of a plastic elastic finger joystick with flattened head 60 at the protruding end of the stick is shown in FIG. 7. The plastic stick 62 can be fabricated in various shapes, colors and elasticity, depending on the application and requirements. In this embodiment the sensor die 10 is mounted directly to the PCB 36 of an electronic device.

Figure 8:
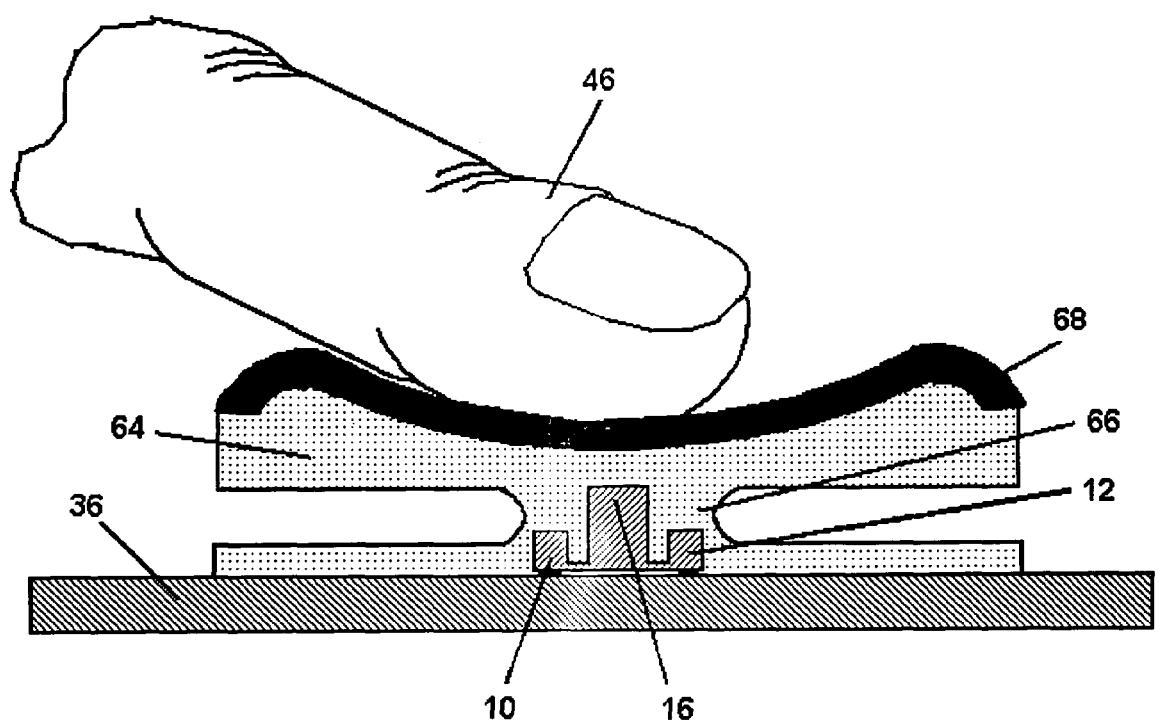
FIG. 8 shows an example of a flexing flat head finger force control device comprised of a rocking elastic plastic button directly coupled to a rigid force-transferring element of a force sensor die and embedded in a layer of plastic, which serves as an integrated button die in accordance with an embodiment of the present invention.

For computer mouse applications at times there is need for small deflections of a button as compared with large joystick applications, but the height of an input control device can be governing. For these applications, as illustrated in FIG. 8, the spring element providing required range of deflection and sensitivity can be made as a low profile rocking two vertebrae spine design according to another embodiment. Here, the sensor die 10 with the rigid force-transferring island 16 is mounted on the substrate 36. The elastic plastic 64 covers all above elements and forms a flexible neck 66. The top surface of the button is covered with a hard layer of plastic 68 serving as a surface where an external force is applied. The force applied, for example by a finger 46, to the top hard layer 68 of the button, rocks the button 64 creating the mechanical stress and deflection within the plastic in the neck area 66 between the sensor die 10 and the rigid force-transferring island 16. This stress is transferred to the sensor die and finally to the stress sensitive IC components.

Figure 9:
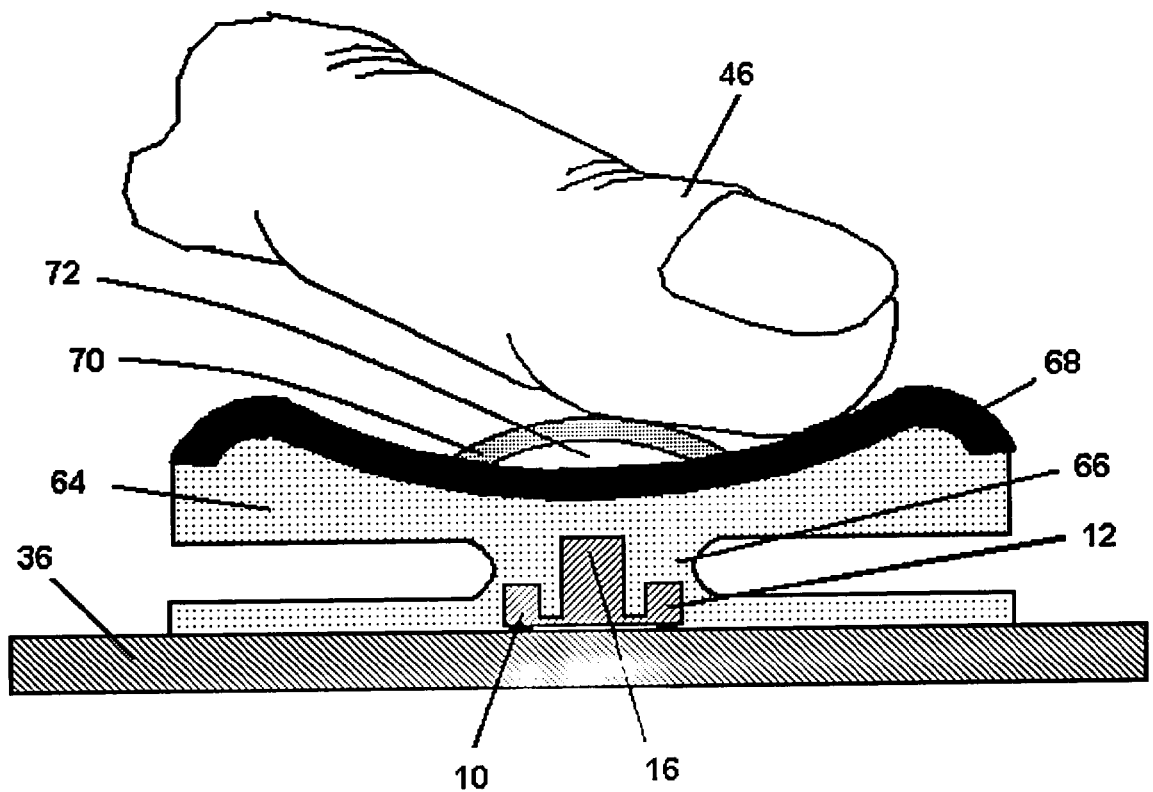
FIG. 9 shows another example of a flexing flat head finger force control device comprised of a rocking elastic plastic button directly coupled to a rigid force-transferring element of a force sensor die and comprising a tactile mechanical feedback on the surface of the button for a tactile sensation mechanical feedback responsive to button depression in accordance with an embodiment of the present invention.

A flexing flat head finger force control device is shown in FIG. 9. It comprises a rocking elastic plastic button 64 directly coupled to a rigid force-transferring island 16 of a force sensor die and comprising a tactile sensation mechanical feedback 70 on the surface of the button 68 allowing sensing the click of the pressed button according to the another embodiment of the present invention.

In the top portion of the plastic button 68 the tactile sensation mechanical feedback 70 allowing sensing the click of the pressed button is incorporated. It has a springy shell structure 70 with the cavity 72 beneath it. When being pressed from the top it reaches the threshold after which it buckles, creating a clicking sensation in the force applying finger 46. This springy shell can be made from different materials including metals and plastics. The clicking action creates not only a tactile feedback but also generates a short pulses in the mechanical sensitive components, which can be used as signal for activation of other programmable action.

Figure 10:
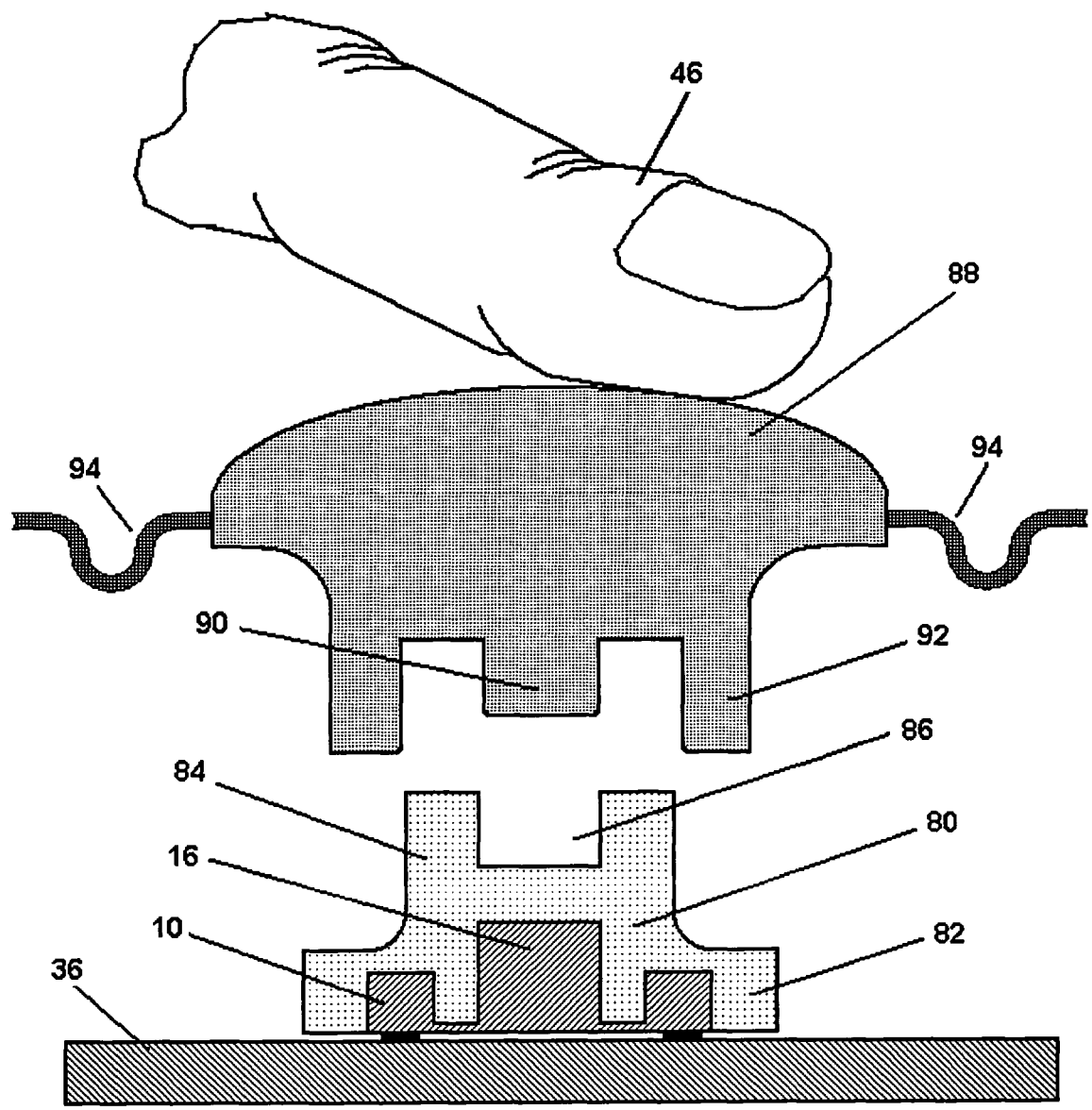
FIG. 10 shows an example of finger force control device based on elastomeric package directly connected to the rigid force-transferring island and comprising connections with different buttons depending with various design die in accordance with an embodiment of the present invention.

Many applications and designs of portable devices require various control buttons in size, shape, color and material while functionality is maintained. In an embodiment of the invention, a detachable button, as illustrated in FIG. 10, can be used.

The finger force control device has an elastomeric package 80 directly connected to the sensor die 10 comprising rigid force-transferring island 16. It also comprises means 84, 86 for connecting with different buttons 88. These buttons also have corresponding and matching means 90, 92 for connecting with control device package 80. The external design of the button 88 depends on specific application requirements. The button 88 can be either a separate component or can be integrated in the mat 94 of the keyboard of portable device.

In some applications, the small surface size of the rigid island pin might not provide a long-term strong adhesion between the pin and the plastic material of the button attached. An increased surface of the rigid pin can be achieved by fabricating an additional force-transferring element 35, as it shown in FIG. 11 according to the another embodiment of the present invention. This force-transferring element may have a hole where rigid pin can be inserted and mechanically connected to the pin with either glue, or solder, or some other attaching mechanism. This force-transferring element can be made from different materials, for example from plastic, metal, semiconductor, ceramic, etc. It also can be connected and bonded to the pin in a batch fabrication manner, for example to the whole wafer or to a number of wafers at the same time.

Figure 11:
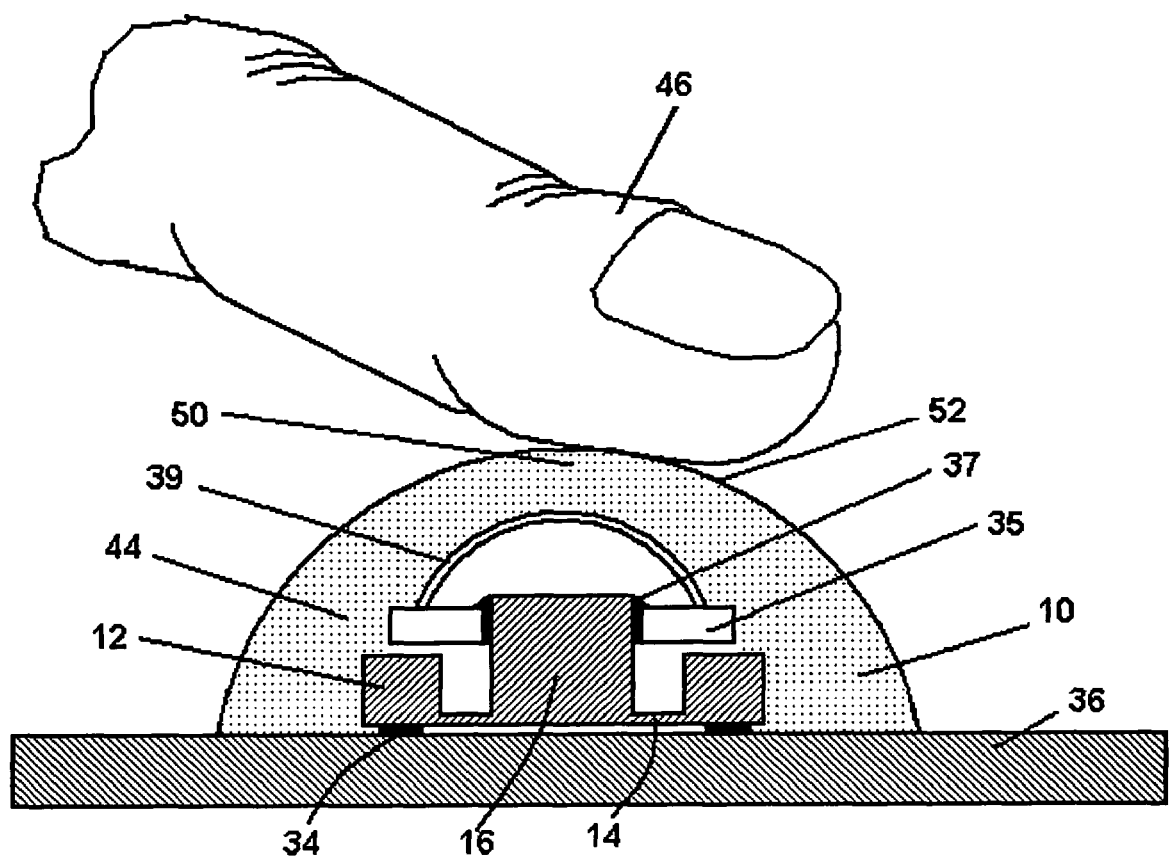
FIG. 11 shows an example of a flat finger force control device with an additional force-transferring element and a springy shell for sensing the click of a depressed button in accordance with an embodiment of the present invention.

An additional force-transferring element 35 can serve, as a platform for mounting a springy shell 39, as shown in FIG. 11. This springy shell 39 can be mounted on the surface of force-transferring element either individually with automated pick and place equipment or in a batch fabrication manner.

There are different designs. One is that a substrate, with the additional force-transferring elements, is bonded to the wafer of force sensor dice and then with the substrate of the springy shells. Another design is substrate with the additional force-transferring elements bonded first to the substrate of the springy shells and then to the wafer with the force sensor dice. The sensor die, the additional force-transferring element and the springy shell, after singulation from the wafer, are covered with plastic material 44, as shown in FIG. 11, forming an external force-transferring element for contact with an external force, eg. a finger 46.

Figure 12:
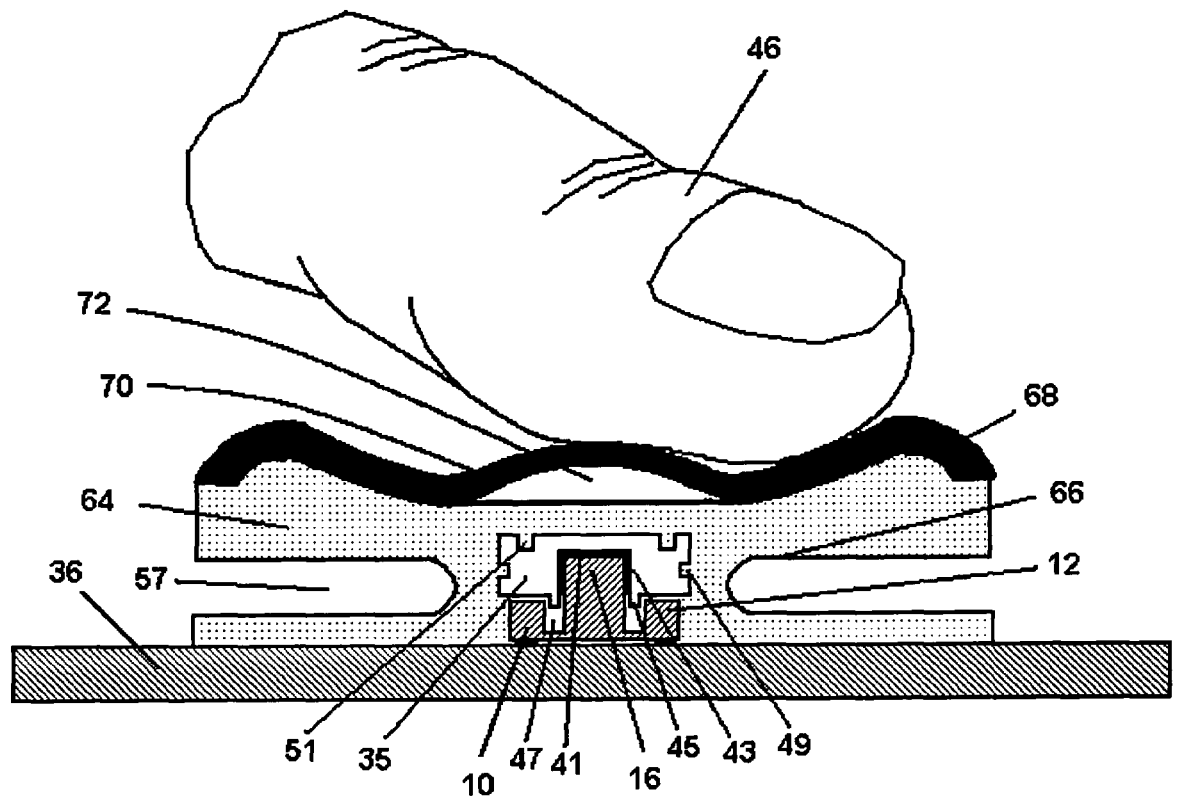
FIG. 12 shows another example of a flexing flat head finger force control device comprised of a rocking elastic plastic button directly coupled to an additional force-transferring element having increased bonding force to the plastic button and comprising a tactile mechanical feedback on the surface of the button for a tactile mechanical feedback responsive to button depression in accordance with an embodiment of the present invention.
Figure 13:
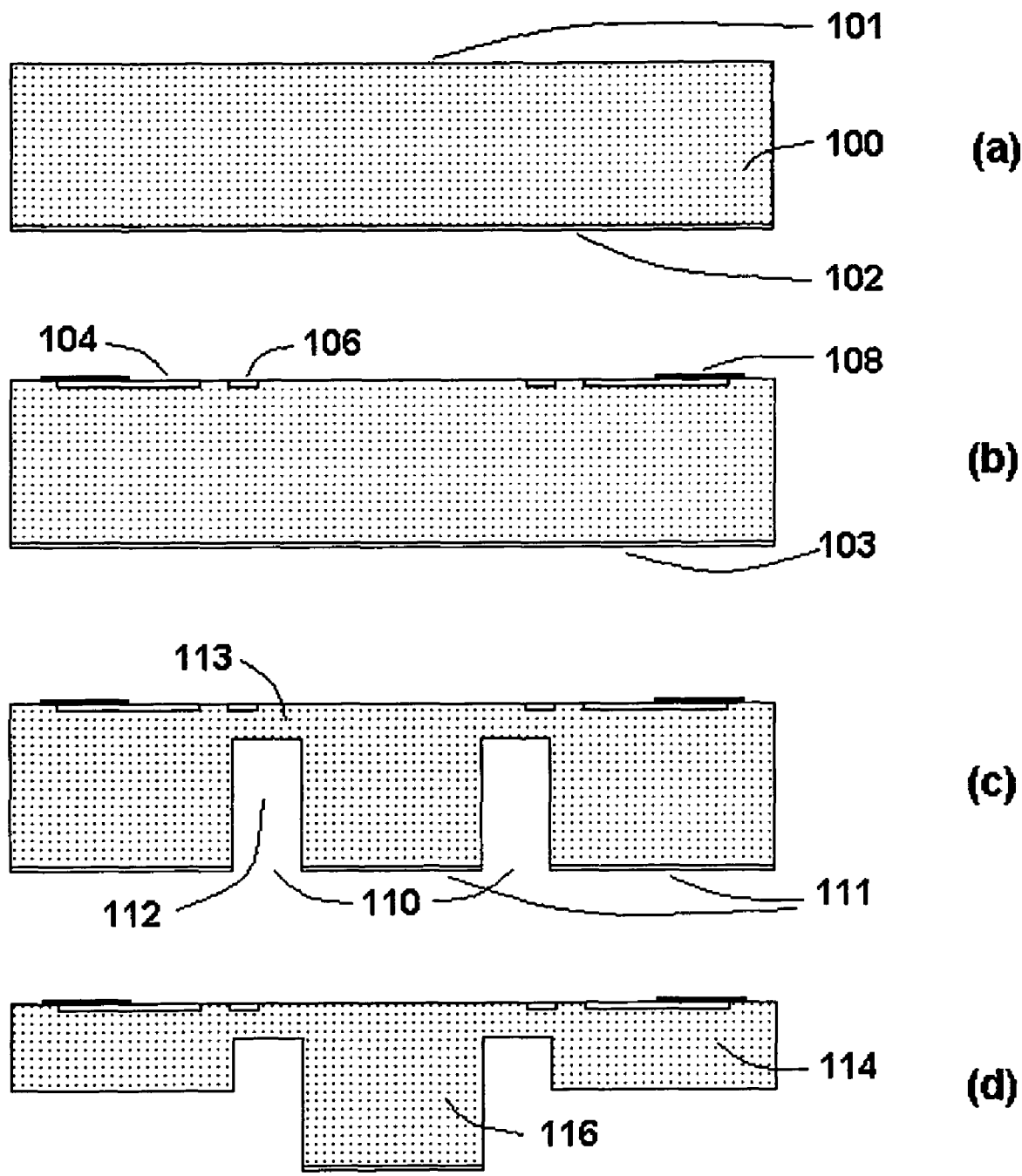
FIG. 13 shows an example of a fabrication process based on the local etching of the diaphragm first and then thinning the die frame in accordance with an embodiment of the present invention.

An additional force-transferring element 35, shown in FIG. 12, can be more complex in shape according to another embodiment of the present invention. This force-transferring element also can be made from a variety of materials, including plastic, metal, semiconductor, ceramic, etc. It also can be connected and bonded to the pin in a batch fabrication manner at the wafer level.

In another embodiment, an additional force-transferring element 35 has a cavity 41 for accepting the rigid pin 16, which are bonded with adhesive material 43. There is a portion 45 which is inserted into the trench 47 proximate to the rigid pin 16 and serves several purposes. First, it increases the surface of connection with the pin and strengthens bonding and reliability of the device. Second, it prevents plastic 64 from going into the trench 47 during molding of the external force-transferring element. Third, it serves, as an additional stop, limiting mechanical overload in X, Y and Z directions.

The additional force-transferring element 35 has cavities or bumps 49, 51 on the surface of this element for stronger bonding with plastic material 64 of the external force-transferring element. It provides higher reliability.

Fabrication of a 3D force sensor die from a single substrate and for the lowest cost represents the biggest challenge. There are several options in batch fabricating senor dice.

FIG. 13a-13d illustrate the fabrication according to the another embodiment of the present invention. FIG. 13a shows an initial silicon substrate 100 having surface one 101 and surface two 102. The wafer initially goes through the standard CMOS process fabricating IC circuitry 104, sensitive components 106 and contact pads 108, as it shown in FIG. 13b. After a standard CMOS process, a masking layer 103 is deposited on the side two of the wafer. A double-side lithography is made from the side two of the wafer opening the elastic element area 110, leaving the masking layer 111 on the frame and the rigid island, as shown in FIG. 13c. Next a deep local etching of silicon wafer is applied from the backside of the wafer forming the trench 112 to the depth for design dimensions the elastic element 113. Local etching can be done by different types of dry or wet etching known in the art, for example by RIE, dry plasma etching, electro-sparking, wet isotropic and anisotropic etching, etc. After that silicon is removed locally from the frame elements 114 backside of the wafer, as it shown in FIG. 13d. As a result, the height dimension of the rigid islands 116 becomes larger than the remaining thickness if the frame 114 minus thickness of the elastic element 113. The last step of removing silicon from the frame area can be done by different ways including mechanical milling, electro-sparking, abrasive milling and different kind of etching, dry and wet.

Figure 14:
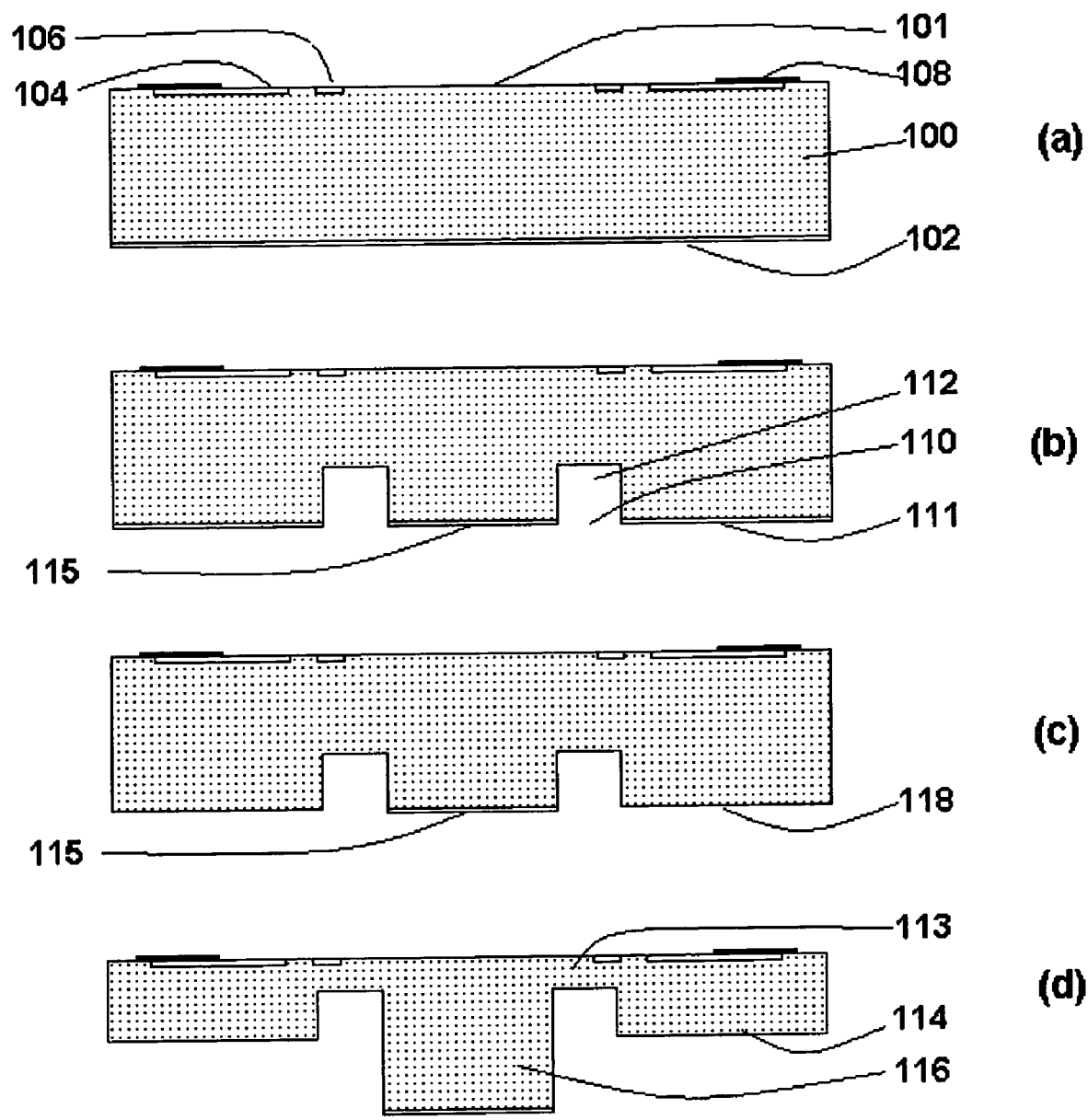
FIG. 14 shows an example of a fabrication process based on the local etching of the diaphragm to a certain depth, and then thinning the die frame and continuing etching the diaphragm at the same time in accordance with an embodiment of the present invention.

FIG. 14a-14d illustrates a fabrication method according to another embodiment of the present invention. FIG. 14 a shows an initial silicon substrate 100 having front surface (side one) 101 and back surface (side two) 102. The wafer first goes through the standard CMOS process fabricating IC circuitry 104, sensitive components 106 and contact pads 108, as it shown in FIG. 14a. After a standard CMOS process, a masking layer 111 is deposited on the backside of the wafer. A double-side lithography is made from the backside of the wafer opening the elastic element 110 and leaving the masking layer 111 on the frame and 115 on the rigid island, as shown in FIG. 14b. Next a deep local etching of silicon wafer is made from the backside of the wafer forming the trench 112 to the depth equal to the difference between the final thickness of the frame and design thickness of the elastic element 113. This local etching can be done by different types of dry or wet etching known in the art, RIE, dry plasma etching, electro-sparking, wet isotropic, anisotropic etching, etc. Next that masking layer 111 is removed from the frame element 118, as shown in the FIG. 14c. The etching process from the backside of the wafer continues etching elastic element and frame element simultaneously, shown in FIG. 14d. As a result, the height dimension of the rigid island 116 becomes larger than the remaining thickness of the frame 114 minus thickness of the elastic element 113 and the thickness of the elastic element reaches design thickness. The step of removing silicon from the elastic element and frame element can be done in various ways including different kind of etching, dry and wet, for example by RIE.

Figure 15:
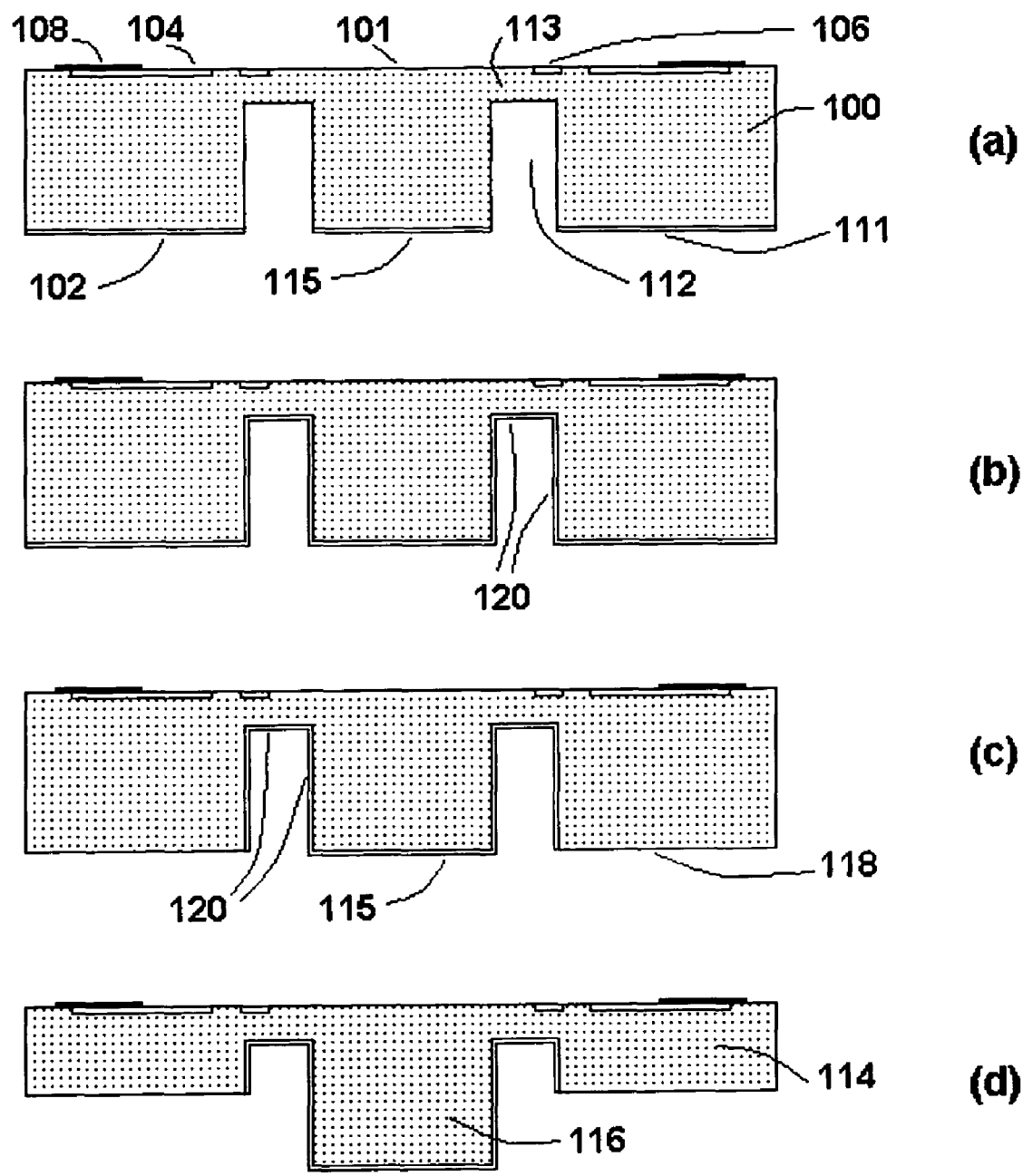
FIG. 15 shows an example of a fabrication process based on the local etching of the diaphragm first, then depositing a mask layer on the diaphragm area and then thinning the frame by etching die in accordance with an embodiment of the present invention.

FIG. 15a-15d illustrate the fabrication method according to yet another embodiment of the present invention. FIG. 15a shows a silicon substrate 100 having front surface 101 and back surface 102 after a CMOS process was completed and the trenches 112 around rigid island 116 were etched forming an elastic element 113. After that a masking layer 120 is deposited on the backside of the wafer masking the sidewalls of the trenches and the surface of the elastic element 113, as it shown in FIG. 15b. The next step is removing a masking layer from the frame area 118, as shown in FIG. 15c leaving the mask 115 and 120 on the rigid island and trench including back surface of the elastic element 113. Next the silicon is removed locally from the frame areas from the backside of the wafer, as it shown in FIG. 15d. As a result, the height dimension of the rigid islands 116 becomes larger than the remaining thickness if the frame 114 minus thickness of the elastic element 113. The last step of removing silicon from the frame area can be done in a variety of ways including different kind of etching, dry and wet.

One of the challenges in methods described above is removing mask from the frame element, when some kind of profile is already fabricated on the backside of the wafer. This can be achieved by masking the backside of the wafer by two layers of masking materials having etching selectivity to each other and two lithographic processes made on the initial flat surface of the wafer backside according to another embodiment of the present invention.

Figure 16:
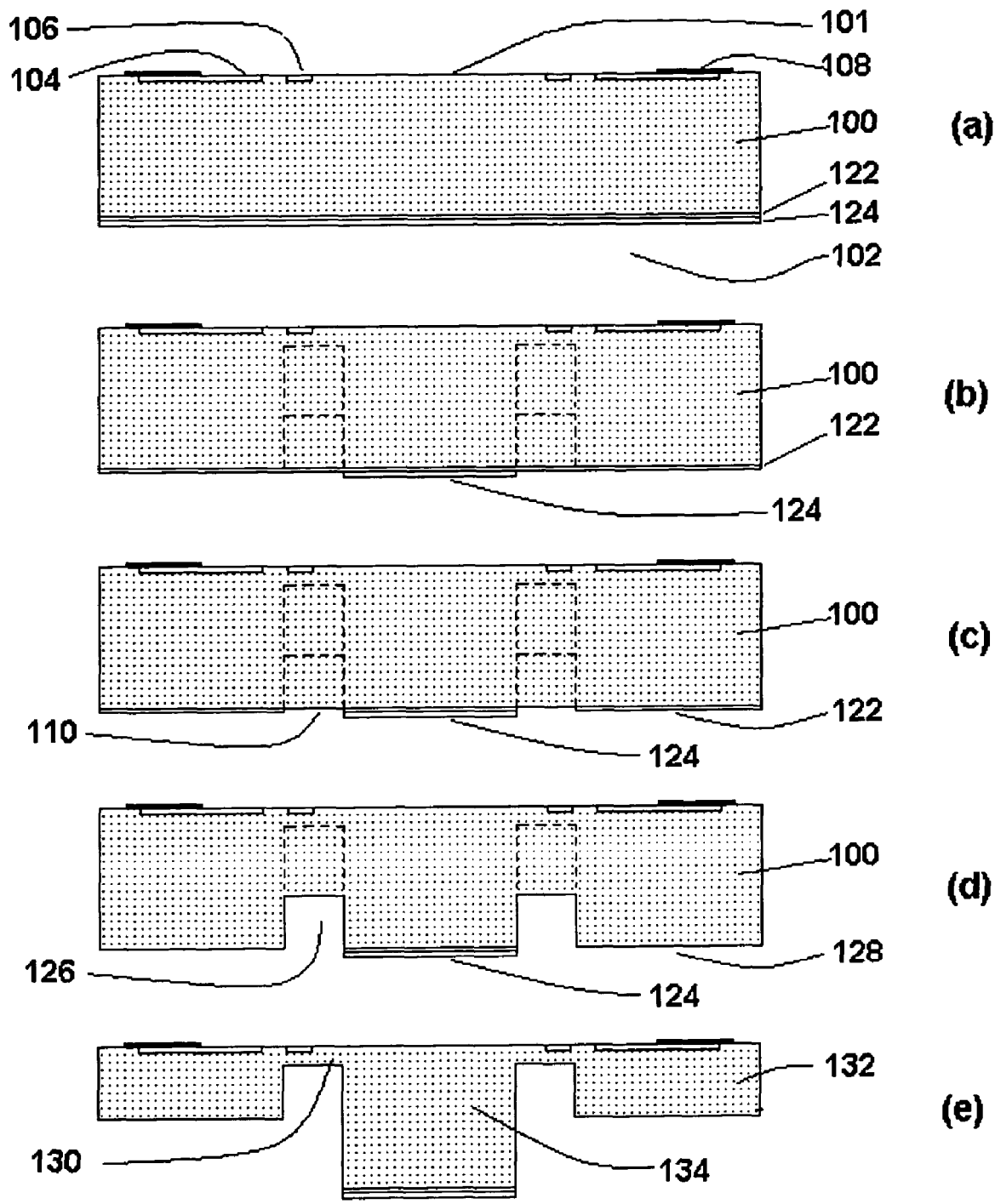
FIG. 16 shows an example of a fabrication process based on deposition of two layers of masking materials and two lithographic processes allowing etching a step profile fabricating the diaphragm area and thinning the frame in accordance with an embodiment of the present invention.

FIG. 16 a shows a silicon substrate 100 having front surface 101 and back surface 102 after CMOS process. Next two masking layers 122 and 124 are deposited on the backside of the wafer, as it shown in FIG. 16a. The masking layer 124 adds high selectivity of etching to masking layer 122. The next step is removing the masking layer 124 from the frame element and elastic element leaving it only on the rigid islands, as shown in FIG. 16b. A second lithography follows, opening the elastic element 110 in the masking layer 122, as shown in the FIG. 16c. As a result, the backside of the wafer has three different etched elements: unmasked area 110, frame element masked with one masking layer 122 and rigid island element masked with masking layers 122 and 124. Next the silicon is etched locally in the elastic element through the masks 122 and 124 to a predetermined depth. Following that the masking layer 122 is etched from the frame element 128 leaving the mask 124 on the rigid island, as shown in FIG. 16d. The next step is a simultaneous etching of the frame and the elastic elements, as shown in FIG. 16e. As a result, the height dimension of the rigid islands 134 becomes larger than the remaining thickness of the frame 132 minus thickness of the elastic element 130 and protrude outward from the substrate.

Figure 17:
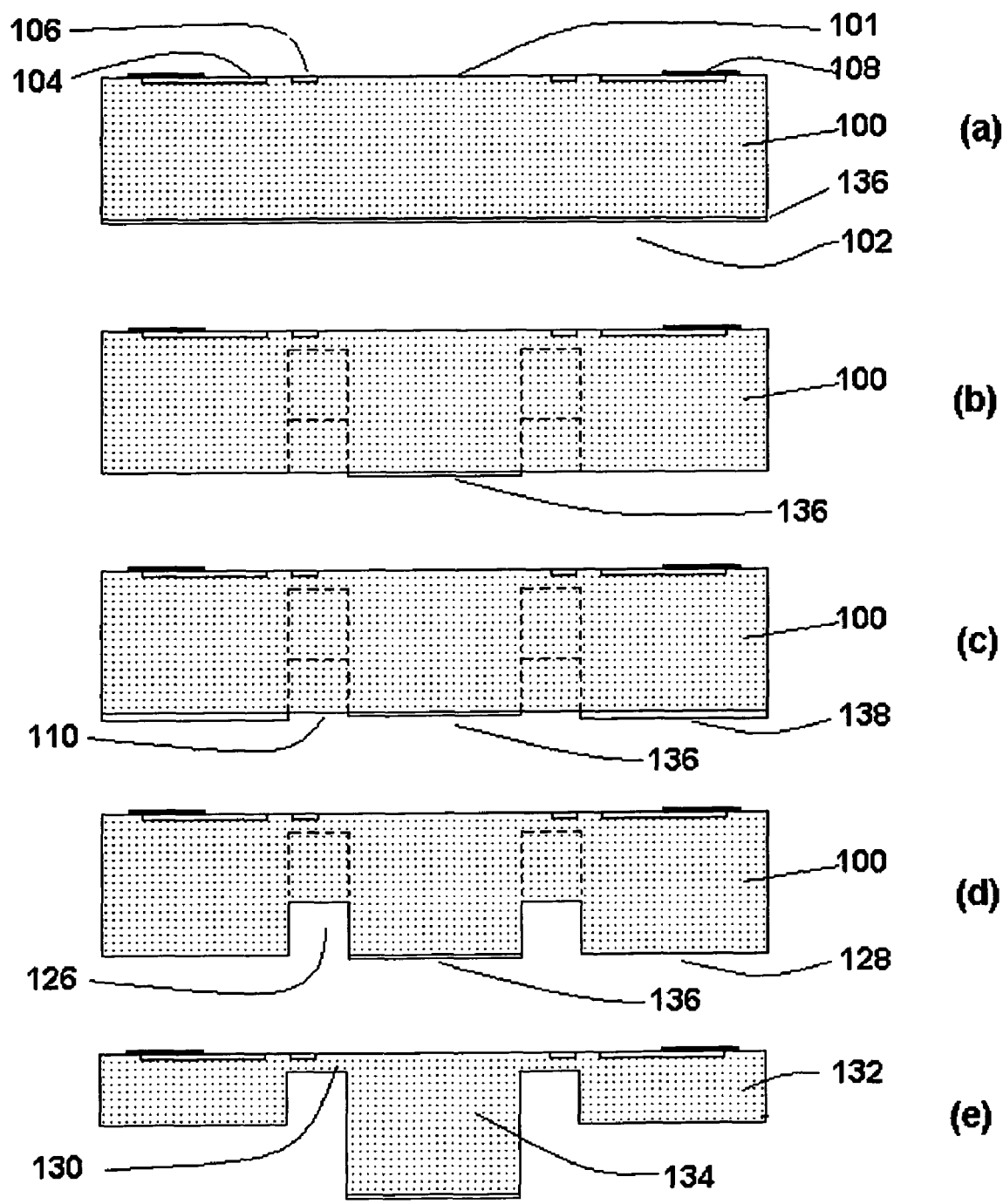
FIG. 17 shows an example of a fabrication process based on deposition of one layer of masking material and two lithographic processes allowing etching a step profile fabricating the diaphragm area and thinning the frame die in accordance with an embodiment of the present invention.

Another process of a double masking process from the backside of the wafer is presented in FIG. 17a-17e according to another embodiment of the present invention. FIG. 17a shows a silicon substrate 100 having front surface 101 and back surface 102 after CMOS process. Next a masking layers 136 is deposited on the backside of the wafer 102, shown in FIG. 17a. The next step is removing a masking layer 136 from the frame and from the elastic element leaving the layer only on the rigid islands, shown in FIG. 17b. A second lithography follows, opening the elastic element 110, as shown in the FIG. 17c. As a result, the backside of the wafer has three different areas: unmasked area 110, frame element masked with photoresist layer 138 and rigid island element masked with masking layer 136. On the next step silicon is etched locally in the elastic element area through the masks 136 and 138 to a predetermined depth. Next the masking photoresist layer 138 is etched off the frame 128 leaving the mask 136 on the rigid island, as shown in FIG. 17d. The final step is a simultaneous etching of the frame and the elastic element, shown in FIG. 17e. As a result, the height dimension of the rigid islands 134 becomes larger than the remaining thickness of the frame 132 minus thickness of the elastic element 130.

The deep etching of the trenches surrounding the rigid islands also etches a substantial part of the wafer thickness, and this process can also be useful for the purpose of singulating the dice from the wafer without conventional dicing, reducing the overall cost of the device in accordance with another embodiment of the present invention.

Figure 18:
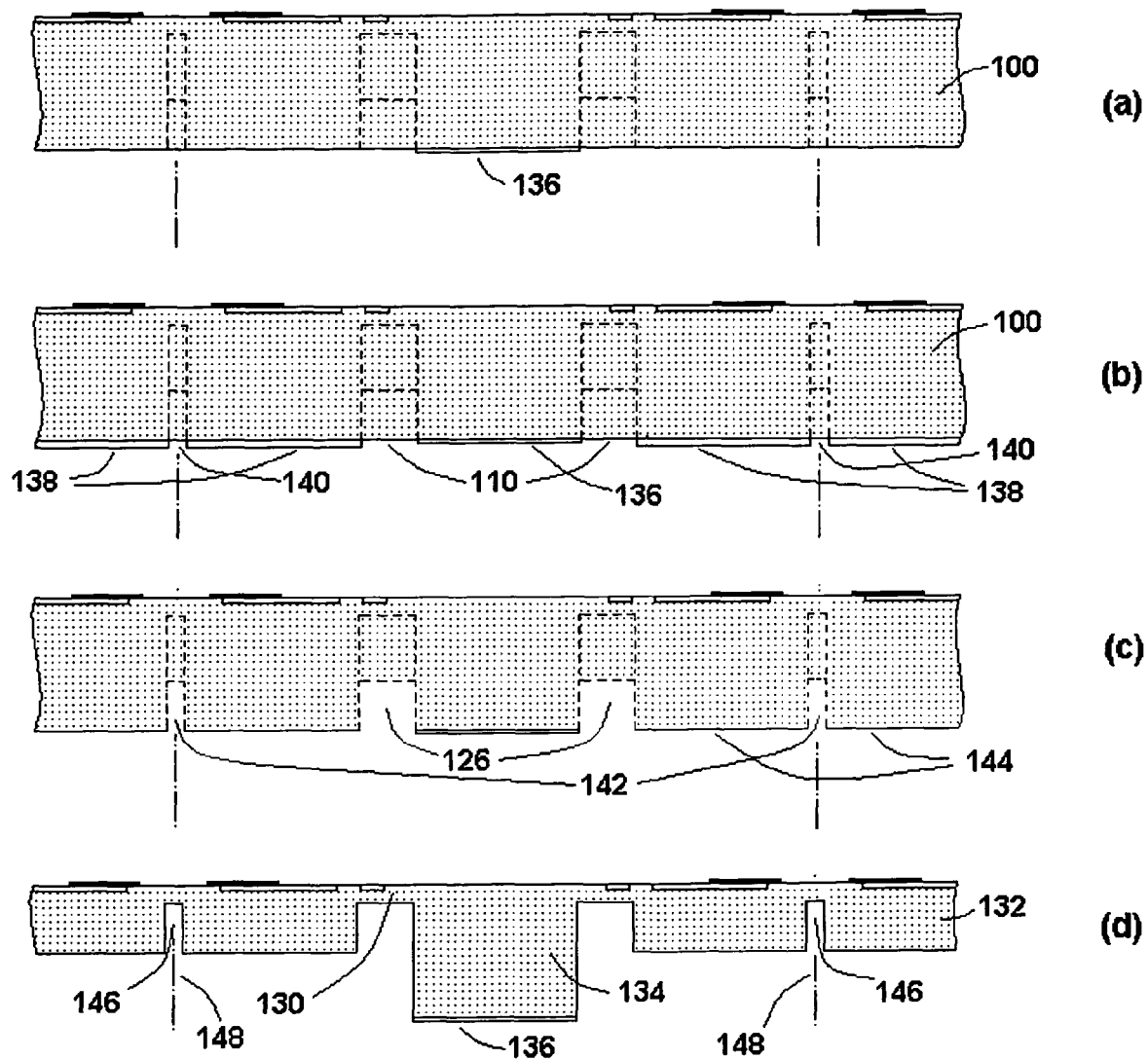
FIG. 18 shows an example of a fabrication process based on deposition of one layer of masking material and two lithographic processes allowing etching an elastic element, separating trenches for dicing and thinning the frame at the same time in accordance with an embodiment of the present invention.

FIG. 18a shows a silicon substrate 100 after CMOS process with the substrate backside of the wafer masked in the rigid islands with the masking layer 136. The second lithography is following up opening the elastic element 110 and dicing trenches 140, as shown in the FIG. 18b. As a result, the backside of the wafer has four different areas: unmasked elastic element area 110, unmasked dicing trenches 140, frame masked with photoresist layer 138 and rigid island masked with masking layer 136. On the next step silicon is etched locally in the elastic element 126 and in the dicing trenches 142 through the masks 136 and 138 to a predetermined depth. Next the masking photoresist layer 138 is etched from the frame area 144 leaving the mask 136 on the rigid island, as shown in FIG. 18c. A simultaneous etching of the frame, the elastic elements and dicing trenches occurs, shown in FIG. 18d. As a result, the height dimension of the rigid islands 134 becomes protruded from the substrate, over the remaining thickness of the frame 132. This occurs simultaneously with the formation of the dicing trenches 146 for singulation of the dice from the wafer.

Figure 19:
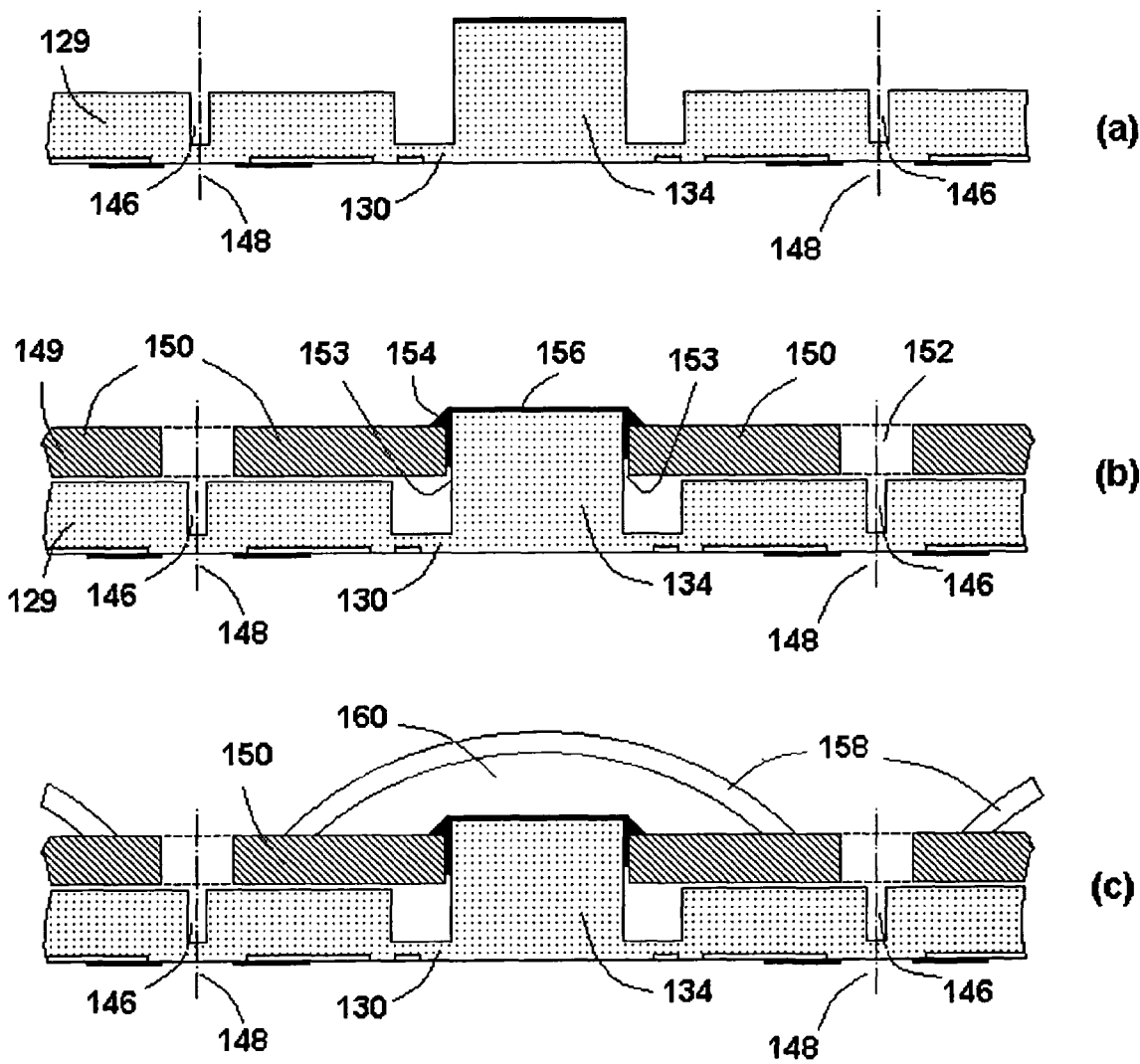
FIG. 19 illustrates additional steps in fabrication of an alternate larger surface for force-transferring element, for providing stronger adhesion between the pin and the plastic material on the top of the die, in accordance with the another embodiment of the invention.

FIG. 19 illustrates additional steps in fabrication process, according to the another embodiment. These steps allow fabricating an additional force-transferring element 150, as it shown in the FIG. 19. This force-transferring element has much larger surface as compared to the surface of the rigid pin 134. It provides a long-term strong adhesion between the pin and the plastic material on the top of the die.

FIG. 19a shows the completed sensor wafer with the rigid pins protruding from the surface of the substrate wafer. The mechanical substrate wafer 149 is then aligned with the sensor wafer 129 so that pins 134 go through the coupling holes 153 in the substrate 149. Then two wafers are bonded together with material 154, 156. This material can be adhesives, solder, or other material creating strong and rigid bonding between two wafers. The individual elements 150 might be separated from each other at the wafer level by the combination of slots and bridges 152, as it shown in FIG. 19b. These slots and bridges are fabricated in the substrate, as holes for the pins are fabricated for mating. At this point the bonded wafers can be diced and application of plastic material on the top of the die for forming external force-transferring element can proceed.

As a continuation of this embodiment, FIG. 19c illustrates additional steps in fabrication process. These steps include mounting springy shells 158, as shown in FIG. 19c. These springy shells 158 can be mounted on the surface of force-transferring elements 150 either individually with automated pick and place equipment or in a batch fabrication manner. Next the bonded wafers with springy shells can be diced and/or application of plastic material on the top of the die for forming external force-transferring elements in a batch process.

Figure 20:
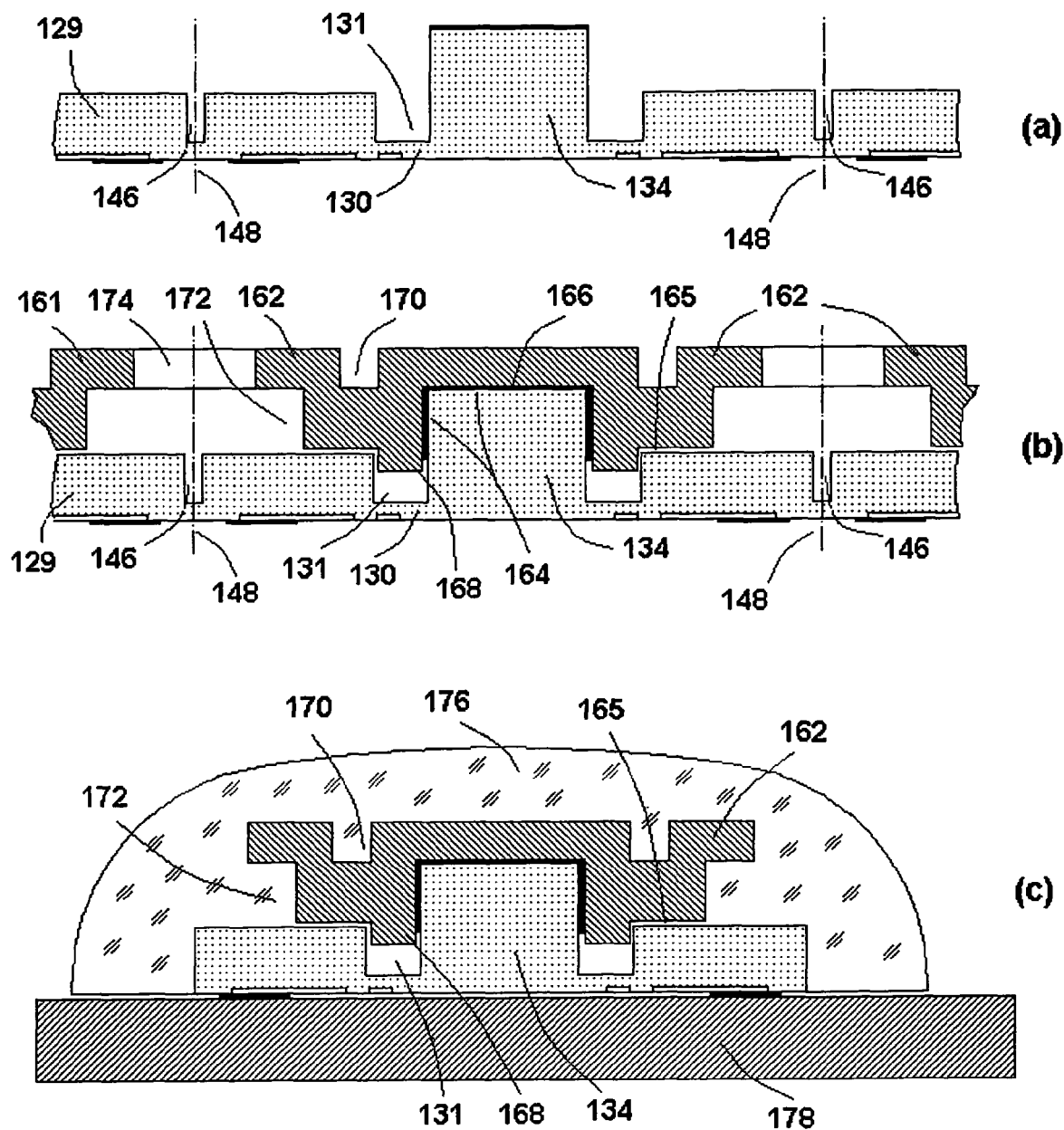
FIG. 20 illustrates another additional steps in fabrication of an alternate larger surface for force-transferring element, for providing stronger adhesion between the pin and the plastic material on the top of the die and providing additional force overload protection, in accordance with the another embodiment of the invention.

FIG. 20 illustrates the back-end of fabrication process according to another embodiment of the invention. FIG. 20a shows the completed sensor wafer with the rigid pins protruding from the surface of the wafer. The mechanical substrate or wafer 161 is provided. This mechanical substrate can be made from different materials, for example from plastic, metal, semiconductor, ceramic, etc. At least one surface of this mechanical substrate has been profiled in such a way that the cavities 166 for accepting the rigid pins 134 are formed. The other micro-structural elements such as ridges 168, cavities 172 and cavities or trenches 170 along with the other designed micro-structural elements could be fabricated at the same time with the cavities 166 for the pins 134. The mechanical substrate is aligned with the sensor wafer 129 so that pins 134 go into the cavities 166 in the mechanical substrate 161. The depth of the cavity 166, the height of the pin 134 and the thickness of the bonding material 164 all together determine the gap 165 between the frame of the sensor wafer 129 and the additional force-transferring element 162. At the same time ridges 168 go into the closed trench 131 around the pin 164. At the next step two wafers are bonded together with bonding material 164. This material can be either different kind of adhesives or solder, or other material creating strong and rigid bonding between two wafers. The individual elements 162 might be separated from each other at the substrate level by the combination of slots and bridges 174, as it shown in FIG. 20b. These slots and bridges are fabricated in the mechanical substrate at the same time, as the other micro-structural elements 166, 168, 170, 172 are fabricated. At this stage the bonded wafers are diced and then plastic material 176 is applied on the top of the dice in a batch-manufacturing manner for forming external force-transferring elements, as it shown in FIG. 20c. In the process of molding the material 176 the external force-transferring elements this material will go into the cavities 170, 172 creating strong and reliable mechanical connection with the additional force-transferring element 162. At the same time the small gaps 165 and the ridges 168 would prevent plastic material 176 from going into the closed trenches 131 around the pin 134.

Is should be noted, that the fabrication of the devices, according to this invention, on a common substrate carries inherent advantages from integration with other analog and digital circuits, circuits which provide but are not limited to analog signal amplification, analog-to-digital and digital-to-analog conversion, multiplexing, signal processing, gate logic, memory, digital interface, power management, encryption, compression and decompression, mixed signal processing, transmitting and receiving wireless signals, sensing components of other than force physical domains and combinations.

It should be understood that the microstructures of the die, structures of the finger-mice, finger buttons and micro-joysticks and methods of their fabrication do not limit the present invention, but only illustrate some of the various technical solutions covered by this invention. While the invention has been described in detail with reference to preferred embodiments, it is understood that variations and modifications thereof may be made without departing from the true spirit and scope of the invention.

Therefore, while the invention has been described with respect to a limited number of embodiments, those skilled in the art, having benefit of this invention, will appreciate that other embodiments can be devised which do not depart from the scope of the invention as disclosed herein. Other aspects of the invention will be apparent from the following description and the appended claims.

What is claimed is:

1. A three-dimensional force input control device for sensing vector forces and converting them into electronic signals for processing on a single substrate comprising:

a sensor die comprising a force transferring rigid island, wherein the sensor die is sensitive to a magnitude and a direction of an external force applied to the force transferring rigid island within the sensor die, and wherein the sensor die further comprises an elastic element coupled to the force transferring rigid island, die frame coupled to a periphery of the elastic diaphragm element, a plurality of stress sensitive components on the elastic diaphragm element, and signal processing IC coupled electrically to the substrate, wherein all elements of the sensor die are formed within a single semiconductor substrate.

2. A three-dimensional force input control device for sensing vector forces, as in claim 1 further comprising:

an external force transferring element covering the sensor die, the external force transferring element perceiving the external force and providing transferring of the external force into the rigid island of the sensor die, wherein the rigid island transfers the force to the elastic member and is detected by the stress sensitive components that generate a combination of output signals dependent on the magnitude and the direction of the external force applied, wherein the external force transferring element is made from a material, that is applied to multiple sensor dice in a batch fashion, the material being selected from the group of materials that includes one or more of: plastic materials, elastic materials, rubber-like materials and combination of plastic materials, elastic materials and rubber-like materials.

3. A three-dimensional force input control device for sensing vector forces and converting them into electronic signals for processing on a single substrate comprising:

a sensor die formed within a single semiconductor substrate;

an elastic element within said semiconductor substrate;

a frame formed around said elastic element and coupled with at least part of the periphery of said elastic element all within the substrate;

at least three mechanical stress sensitive IC components formed within the semiconductor substrate and located in the elastic element for providing electrical output signals proportional to mechanical stress in the location of the IC components;

at least one rigid island element formed in the semiconductor substrate, the at least one rigid island element is coupled with the elastic element and transfers an external vector force to the elastic element and through to the IC components, which provide electrical output signal, wherein the height of the rigid island is bigger than the difference between the thicknesses of the frame and the elastic element.

4. The force input device in claim 3, wherein the semiconductor substrate is made from material selected from the group of: silicon, germanium, silicon carbide, diamond-like carbon, gallium arsenide, gallium nitride, indium phosphide, and elements from III, IV and V groups of the Periodic Table.

5. The force input device in claim 3, wherein the elastic element in the semiconductor substrate has an annular or n-sided polygon geometry with uniform thickness smaller than the adjacent frame element, the rigid island element is located in a central area of the elastic element.

6. The force input device in claim 3, wherein the elastic element has a non-uniform thickness.

7. The force input device in claim 3, wherein the elastic element comprises at least one penetration in it's thickness dimension.

8. The force input device in claim 3, further comprising at least one stress concentrating element located on the elastic element and having a shape selected from a group of shapes consisting essentially of V-groove, trapezoidal groove, groove with the sidewalls forming an angle of 90° with the surface of the diaphragm, and combinations thereof.

9. The force input device in claim 3, further comprising rigid island element of shape selected from a group of shapes consisting of cone, cylinder, semi-sphere, sphere, faceted cone, faceted cylinder, faceted semi-sphere, faceted sphere and combinations.

10. The force input device in claim 3, further comprising a rigid island element with at least one non-uniformity selected from a group of non-uniformities consisting of cavity, trench, hole, mesa, ridge, bridge, cantilever, area of negative slope and combinations.

11. The force input device in claim 3, further comprising a spring element coupling the external vector force to the rigid island element, where the spring element is selected from the group of spring elements: spring, thin beam, wire, elastic plastic button, elastic plastic stem, elastic plastic rocker button, spine-like structure, elastic dome with mechanical feedback, plastic shell filled in with liquid, plastic shell filled with gel, elastomeric button or combinations.

12. The force input device in claim 3, further comprising a least one stress sensitive IC component selected from the group of stress sensitive IC components: piezoresistor, pn-junction, tunnel diode, Schottky diode, shear stress component, piezoresistive Wheatstone bridge, MOS transistor, complementary pair of CMOS transistors, bipolar transistor, pair of p-n-p and n-p-n bipolar transistors, bipolar transistor and at least one piezoresistor connected to transistor, MOS transistor and at least one piezoresistor connected to transistor, bipolar transistor circuit, and CMOS transistor circuit or combination.

13. The force input device in claim 3, further comprising electronic circuitry which provide functions selected from a group of functions: analog signal amplification, analog-to-digital and digital-to-analog conversion, multiplexing, signal processing, gate logic, memory, digital interface, power management, encryption, compression and decompression, mixed signal processing, transmitting and receiving wireless signals, sensing various physical domains other than force and combinations.

14. The force input device in claim 3, further comprising an additional rigid force-transferring element connected to the top portion of the rigid island and providing bigger surface area than the top of the rigid island for better connection with an external force-transferring element, for protection of the elastic element from the side of the rigid island and made from a material chosen from the group of materials: plastic, metal, semiconductor, ceramic, glass and combination of the above.

15. The force input device in claim 3, further comprising an additional rigid force-transferring element connected to the top portion of the rigid island and cooperated with a springy shell for mechanical feedback allowing sensing a click of a pressed corresponding button, and where at least one of the stress sensitive IC components generates one or more signals for activation of electronic action.

16. The force input device in claim 3, further comprising an additional rigid force-transferring element connected to the top portion of the rigid island and having additional cavities, trenches, bumps and ridges for better adhesion, for protecting the elastic element and for additional mechanical overload protection.

17. The force input device in claim 3, further comprising a rigid force-transferring element connected to the rigid island where the rigid force-transferring element has a shape of: ring, washer, plate, stick, inverted mushroom, cone; and where the rigid force-transferring element has at a surface at least one element, improving adhesion or gripping force due to an intermediate adhesive layer between the rigid force-transferring element and the rigid island, where the at least one element is chosen from a group of: negative slope, cavity, hole, mesa, bridge, cantilever and combination.

18. The force input device in claim 3, further comprising a button mechanically coupled to one or more of: the rigid island, a force-transferring element coupled with the rigid island, a spring element cooperated with the rigid island, and the frame.

19. The force input device in claim 18, where the button comprises a shape chosen from the group of: convex surface, dome, semi sphere, sphere, flat plate, concave surface, corrugated surface, stick, shell, mushroom and combination.

20. The force input device in claim 3, further comprising a springy shell for mechanical feedback allowing sensing a click of a pressed button and generate signals for activation of electronic action and mechanically coupled to one of: a button cooperated with the rigid island, a force-transferring element coupled with the rigid island, the rigid island, the frame and a combination of two or more of the button, the force-transferring element, the rigid island and the frame.

21. An input control device for inputting a signal representative of an applied force into a processing system comprising:
   a sensor die comprising:
      a substrate;
      at least one rigid island element formed in the substrate;
      an elastic element surrounding said at least one rigid island element within said substrate;
      a frame surrounding said elastic element; and
      at least one IC component formed in the substrate and located on the elastic element and responsive to a force applied to the elastic element;
   at least one force-transferring element coupled to the rigid island formed in the substrate, wherein a force applied to the force-transferring element is transferred to the rigid island and thereby transferred to the elastic element and detected by the at least one IC component, such that the at lease one IC component produces, in response to the force applied, a signal representative of the force applied; and
   at least one electronic circuit coupled to the at least one IC component, where the at least one electronic circuit receives the signal representative of the force applied and in response produces an output signal proportional to the force.

22. The input control device of claim 21, further comprising at least one spring element coupled to the force-transferring element and providing a link between an external force and the force-transferring element.

23. The input control device of claim 22 wherein the output signal is proportional to an amount of deflection of the spring element.

24. The input control device of claim 22 further comprising a button connected to at least one of the following: the spring element, the rigid island, the force-transferring element, the frame or combination of two or more of the spring element, the rigid island, the force-transferring element, and the frame.

25. The input control device of claim 24, wherein the button is a force-transferring element and a spring element.

26. The input control device of claim 21, wherein the force-transferring element is a spring element.

27. The input control device of claim 21 wherein at least one IC component comprises at least one of: a piezoresistor, a pn-junction, a tunnel diode, a Schottky diode, a shear stress component, a piezoresistive Wheatstone bridge, a MOS transistor, a complementary pair of CMOS transistors, a bipolar transistor, a pair of p-n-p and n-p-n bipolar transistors, a bipolar transistor and at least one piezoresistor connected to transistor, a MOS transistor and at least one piezoresistor connected to transistor, a bipolar transistor circuit, and a CMOS transistor circuit.

28. An input control device for inputting a signal representative of an applied force into a processing system comprising:
   a sensor die comprising:
      a substrate;
      at least one rigid island element formed in the substrate;
      an elastic element surrounding said at least one rigid island element within said substrate;
      a frame surrounding said elastic element; and
      at least two IC components formed in the substrate and located on the elastic element and responsive to a force applied to the elastic element;
   at least one force-transferring element coupled to the rigid island formed in the substrate, wherein a force applied to the force-transferring element is transferred to the rigid island and thereby transferred to the elastic element and detected by the at least two IC components, such that each of the at least two IC components produces, in response to the force applied, a respective signal representative of the force applied; and
   at least one electronic circuit coupled to the at least two IC components to receive the signals representative of the force applied, and where the at least one electronic circuit produce an output signal proportional to at least two components of a force vector representative of the force applied to the at least one force-transferring element.

29. The input control device of claim 28, further comprising at least one spring element coupled to the force-transferring element and providing a link between an external force and the force-transferring element, where the output signal is proportional to an amount of deflection of the spring element.

* * * * *